(12) United States Patent
Cho et al.

(10) Patent No.: US 11,903,280 B2
(45) Date of Patent: Feb. 13, 2024

(54) DISPLAY DEVICE

(71) Applicant: LG DISPLAY CO., LTD., Seoul (KR)

(72) Inventors: Youngsung Cho, Gyeonggi-do (KR); Byeong-Seong So, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/979,418

(22) Filed: Nov. 2, 2022

(65) Prior Publication Data
US 2023/0142681 A1 May 11, 2023

(30) Foreign Application Priority Data
Nov. 11, 2021 (KR) .................. 10-2021-0154440

(51) Int. Cl.
*H10K 59/131* (2023.01)
*G09G 3/3225* (2016.01)
(Continued)

(52) U.S. Cl.
CPC ......... *H10K 59/131* (2023.02); *G06F 3/0412* (2013.01); *G09G 3/3225* (2013.01);
(Continued)

(58) Field of Classification Search
CPC .............. G09G 3/3225; G09G 3/3266; G09G 2300/0439; G09G 2300/0819;
(Continued)

(56) References Cited

U.S. PATENT DOCUMENTS

2013/0234974 A1* 9/2013 Guard .................. G06F 3/0445
345/174
2019/0130822 A1 5/2019 Jung et al.
(Continued)

FOREIGN PATENT DOCUMENTS

| KR | 10-2020-0037029 A | 4/2020 |
|---|---|---|
| WO | 2021-027201 A1 | 2/2021 |
| WO | 2021/147160 A1 | 7/2021 |

OTHER PUBLICATIONS

Extended European Search Report issued in application 22204519.7 dated Apr. 5, 2023.
(Continued)

*Primary Examiner* — Hong Zhou
(74) *Attorney, Agent, or Firm* — Morgan, Lewis & Bockius LLP

(57) ABSTRACT

A display device includes a display panel including a plurality of subpixels and a plurality of signal lines, the display panel defining a display area having a first optical area and a normal area outside of the first optical area, and a non-display area. The first optical area includes a plurality of light emitting areas and a plurality of first transmission areas, and the normal area includes a plurality of light emitting areas. The display panel includes a plurality of first horizontal lines, among the signal lines, disposed through the first optical area. The first horizontal lines include a bypass line connected to subpixels at both boundaries of the first optical area and not connected to other subpixels inside of the first optical area, and a non-bypass line connected to the subpixels at both boundaries of the first optical area and the subpixels inside of the first optical area.

18 Claims, 18 Drawing Sheets

(51) Int. Cl.
   *G09G 3/3266* (2016.01)
   *G06F 3/041* (2006.01)
   *G06F 3/044* (2006.01)

(52) U.S. Cl.
   CPC ........... *G09G 3/3266* (2013.01); *G06F 3/044* (2013.01); *G06F 2203/04112* (2013.01); *G09G 2300/0439* (2013.01); *G09G 2300/0819* (2013.01); *G09G 2300/0842* (2013.01); *G09G 2300/0861* (2013.01)

(58) Field of Classification Search
   CPC .... G09G 2300/0842; G09G 2300/0861; G06F 3/0412; G06F 3/044; G06F 2203/04112; H10K 59/131
   See application file for complete search history.

(56) References Cited

U.S. PATENT DOCUMENTS

| | | | | |
|---|---|---|---|---|
| 2020/0410921 | A1* | 12/2020 | Kim | G09G 3/3233 |
| 2021/0013298 | A1* | 1/2021 | Her | H10K 59/1213 |
| 2021/0090503 | A1* | 3/2021 | Lee | G09G 3/3266 |
| 2021/0175303 | A1* | 6/2021 | Bang | H10K 59/122 |
| 2021/0191552 | A1* | 6/2021 | Bok | G06F 1/1652 |
| 2021/0210510 | A1 | 7/2021 | Hsieh | |
| 2021/0233986 | A1 | 7/2021 | Hsieh | |
| 2021/0255731 | A1 | 8/2021 | Kim et al. | |
| 2021/0313405 | A1 | 10/2021 | Xu et al. | |
| 2021/0335920 | A1 | 10/2021 | Hong et al. | |
| 2021/0408146 | A1 | 12/2021 | Ying et al. | |
| 2021/0408182 | A1 | 12/2021 | Chung et al. | |
| 2022/0020321 | A1* | 1/2022 | Jung | H10K 71/00 |
| 2022/0123094 | A1 | 4/2022 | Qiu et al. | |
| 2022/0208096 | A1* | 6/2022 | Matsueda | G09G 3/3275 |
| 2022/0308702 | A1* | 9/2022 | Wang | G06F 3/0448 |

OTHER PUBLICATIONS

First Office Action dated Sep. 19, 2023 for counterpart Japanese Application No. 2022 175225.

* cited by examiner

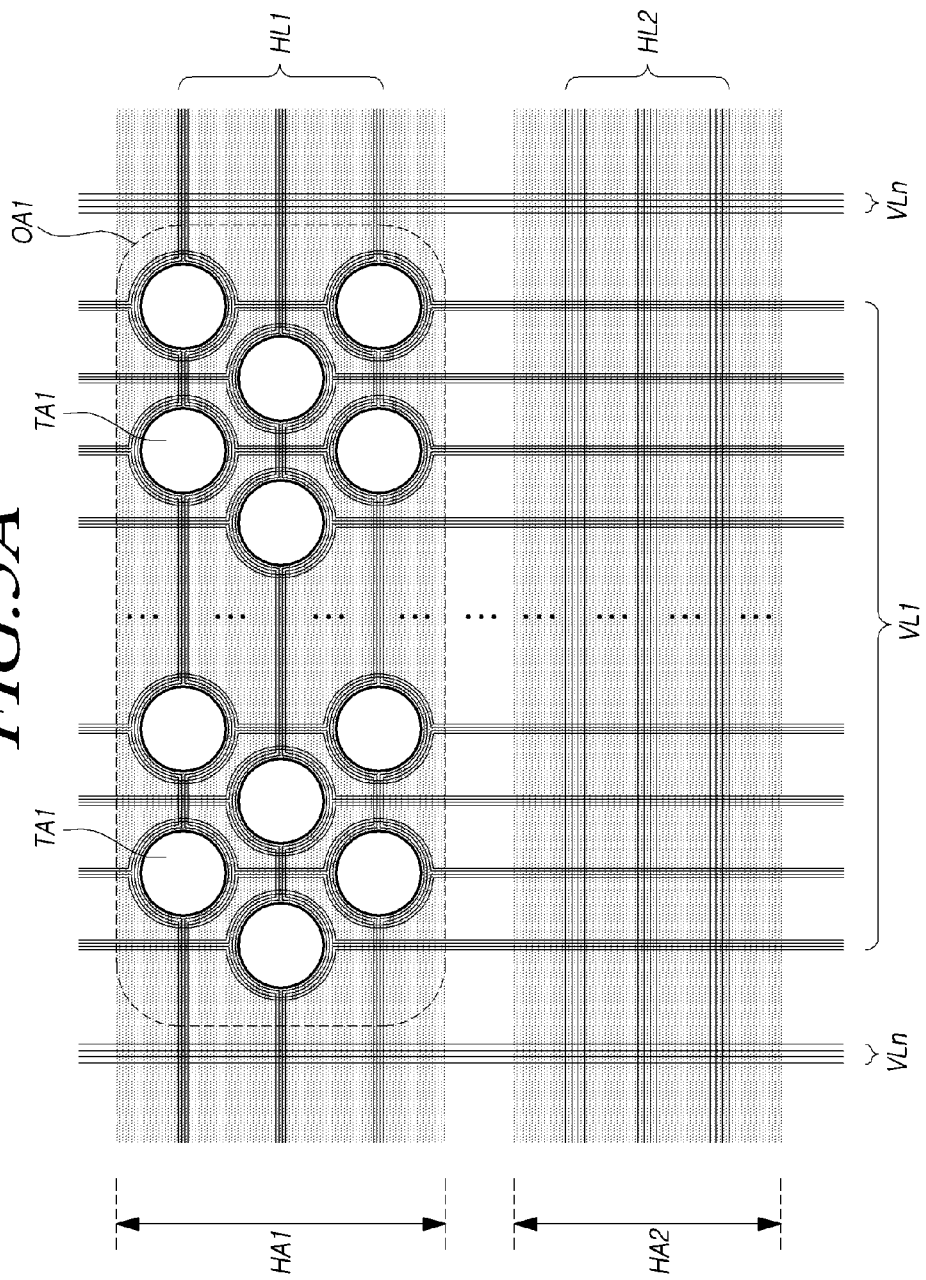

DISPLAY DEVICE

CROSS-REFERENCE TO RELATED APPLICATION

This application claims the priority of Korean Patent Application No. 10-2021-0154440, filed on Nov. 11, 2021, in the Korean Intellectual Property Office, which is hereby incorporated herein by reference in its entirety.

BACKGROUND

Technical Field

The present disclosure relates to an electronic device, and more particularly, to a display device.

Discussion of the Related Art

As display technology advances, display devices can provide increased functions, such as an image capture function, a sensing function, and the like, as well as an image display function. To provide these functions, a display device may need to include an optical electronic device, such as a camera, a sensor for detecting an image, and the like.

In order to receive light passing through a front surface of a display device, it may be desirable for an optical electronic device to be located in an area of the display device where incident light coming from the front surface can be advantageously received or detected. Thus, in such a display device, an optical electronic device may be located in a front portion of the display device to allow the optical electronic device to be effectively exposed to incident light. To install the optical electronic device in such an implementation, an increased bezel of the display device may be designed, or a notch or a hole may be formed in a display area of a display panel of the display device.

Therefore, as a display device needs an optical electronic device to receive or detect incident light, and perform an intended function, a size of the bezel in the front portion of the display device may be increased, or a substantial disadvantage may be encountered in designing the front portion of the display device.

SUMMARY

The present inventors have developed techniques for providing or placing one or more optical electronic devices in a display device without reducing an area of the display area of a display panel of the display device. Through the development, the inventors have invented a display panel and a display device having a light transmission structure in which even when an optical electronic device is located under a display area of the display panel, and thus, is not exposed in the front surface of the display device, the optical electronic device can normally and properly receive or detect light.

Further, the inventors have recognized that an optical area configured in an area of the display area overlapping such an optical electronic device is desired to have a high transmission performance and an excellent light emitting performance for displaying an image, and in turn, signal lines running through the optical area are desired to be disposed taking account of these requirements. However, in the case of typical display panels or display devices, signal lines running through an optical area have been disposed without considerations suitable for the characteristics of the optical area. To address these issues, the inventors have invented a display device in which one or more signal lines running through an optical area overlapping one or more optical electronic devices are disposed in a manner that is suitable for the characteristics of the optical area.

Accordingly, embodiments of the present disclosure are directed to a display device that substantially obviates one or more of the problems due to limitations and disadvantages of the related art.

An aspect of the present disclosure is to provide to a display panel and a display device that are capable of reducing a non-display area of the display panel and enabling an optical electronic device such as a camera, a sensor, and the like not to be exposed in the front surface of the display panel by disposing the optical electronic device under a display area of the display panel.

Another aspect of the present disclosure is to provide a display panel and a display device that have a light transmission structure of enabling an optical electronic device under a display area of the display panel to normally receive light transmitting the display panel.

Another aspect of the present disclosure is to provide a display panel and a display device that are capable of normally performing display driving in an optical area included in a display area of the display panel and overlapping an optical electronic device.

Another aspect of the present disclosure is to provide a display device capable of allowing a signal line to run through the optical area overlapping the optical electronic device in a manner that is suitable for the characteristics of the optical area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a display panel including a plurality of subpixels and a plurality of signal lines, the display panel defining a display area having a first optical area and a normal area located outside of the first optical area, and a non-display area, wherein the first optical area comprises a plurality of light emitting areas and a plurality of first transmission areas, and wherein the normal area comprises a plurality of light emitting areas, wherein the display panel includes a plurality of first horizontal lines among the plurality of signal lines disposed through the first optical area, and wherein the first horizontal lines include a bypass line connected to subpixels at both boundaries of the first optical area and not connected to other subpixels inside of the first optical area, and a non-bypass line connected to the subpixels at both boundaries of the first optical area and the subpixels inside of the first optical area.

According to embodiments of the present disclosure, a display panel and a display device can be provided that are capable of reducing a non-display area of the display panel and enabling an optical electronic device such as a camera, a sensor, and the like not to be exposed in the front surface of the display panel by disposing an optical electronic device under a display area of the display panel.

According to embodiments of the present disclosure, a display panel and a display device can be provided that have a light transmission structure for enabling an optical electronic device under a display area of the display panel to normally receive light transmitting the display panel.

According to embodiments of the present disclosure, a display panel and a display device can be provided that are capable of normally performing display driving in an optical area included in a display area of the display panel and overlapping an optical electronic device.

According to embodiments of the present disclosure, a display device can be provided that is capable of enabling a signal line to run through an optical area overlapping an optical electronic device in a manner that is suitable for the characteristics of the optical area. Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 5A illustrates example arrangements of signal lines in each of a first optical area and a normal area in the display panel according to aspects of the present disclosure;

DETAILED DESCRIPTION

Figure 1A:
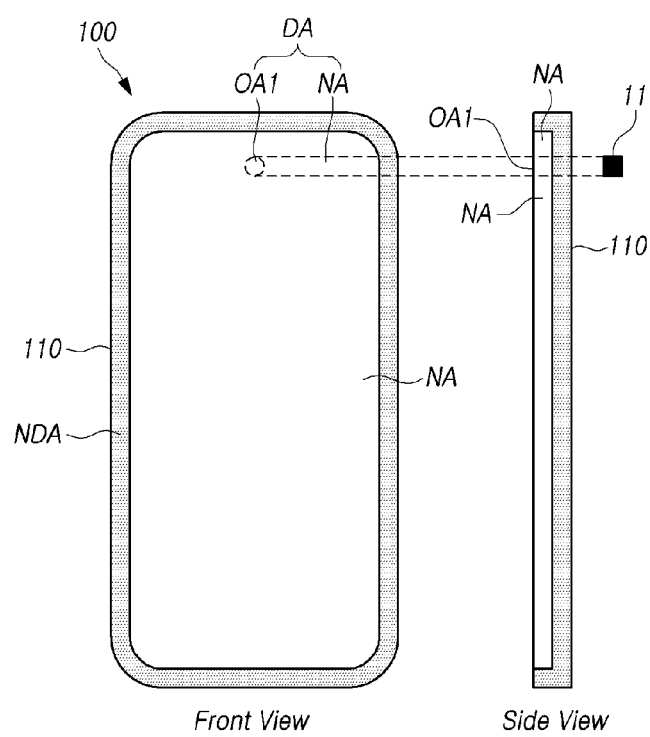
FIGS. 1A, 1B, and 1C are plan views illustrating an example display device according to aspects of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used. In construing an element, the element is to be construed as including an error or tolerance range even where no explicit description of such an error or tolerance range is provided. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element. The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C. Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Figure 1B:
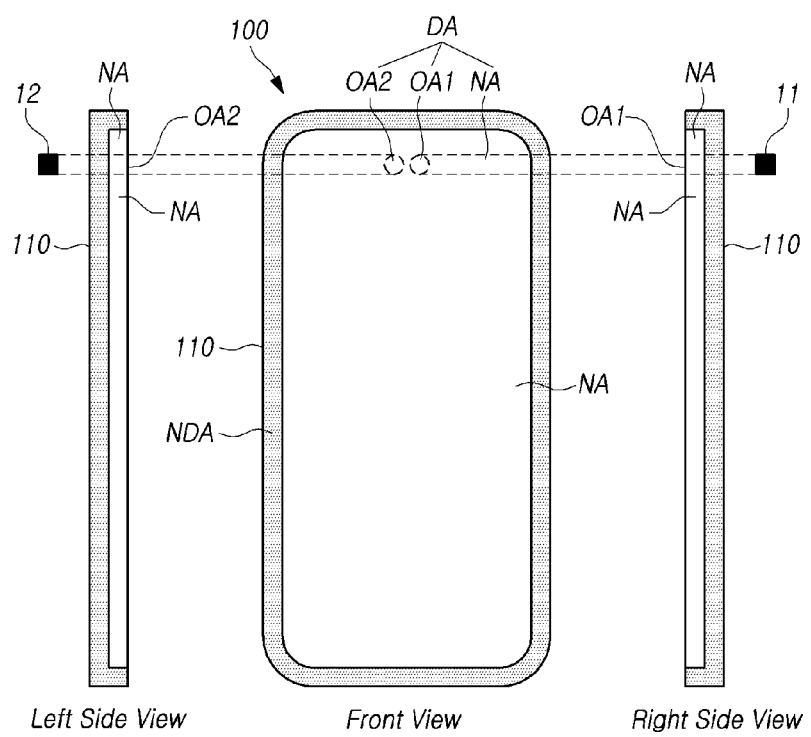
Figure 1C:
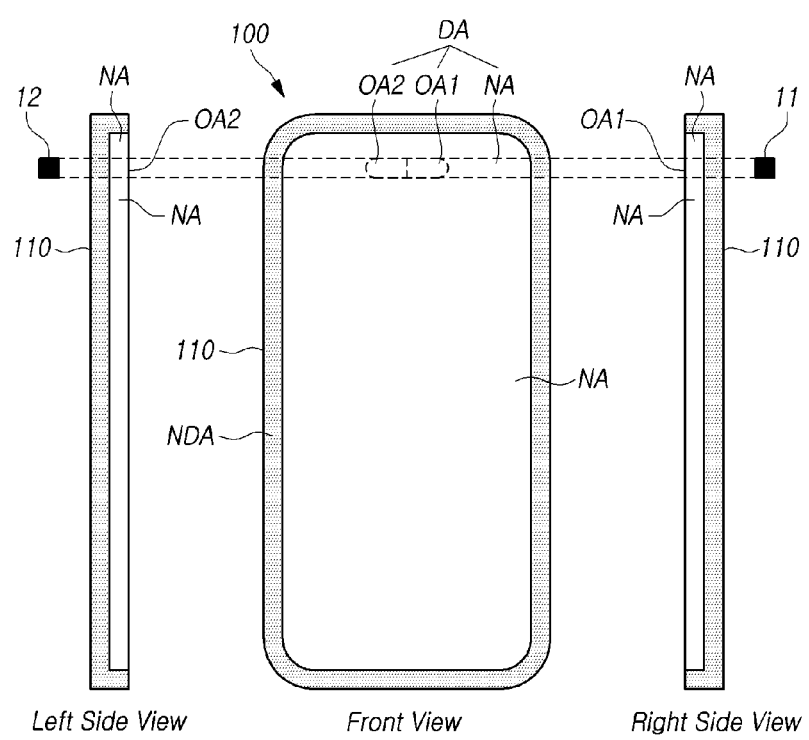

FIGS. 1A, 1B and 1C are plan views illustrating an example display device according to aspects of the present disclosure.

With reference to FIGS. 1A, 1B, and 1C, a display device according to aspects of the present disclosure can include a display panel 110 for displaying an image, and one or more optical electronic devices (11, 12). Herein, an optical electronic device may be referred to as a light detector, a light receiver, or a light sensing device. An optical electronic device may include one or more of a camera, a camera lens, a sensor, a sensor for detecting images, or the like.

The display panel 110 can include a display area DA in which an image is displayed and a non-display area NDA in which an image is not displayed.

A plurality of subpixels can be arranged in the display area DA, and several types of signal lines for driving the plurality of subpixels can be arranged therein.

The non-display area NDA may refer to an area outside of the display area DA. Several types of signal lines can be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

With reference to FIGS. 1A, 1B, and 1C, in the display device 100 according to aspects of the present disclosure, one or more optical electronic devices (11, 12) may be located under, or in a lower portion of, the display panel 110 (an opposite side of a viewing surface thereof).

Light can enter the front surface (viewing surface) of the display panel 110, pass through the display panel 110, reach one or more optical electronic devices (11, 12) located under, or in the lower portion of, the display panel 110 (the opposite side of the viewing surface). The one or more optical electronic devices (11, 12) can receive or detect light transmitting through the display panel 110 and perform a predefined function based on the received light. For example, the one or more optical electronic devices (11, 12) may include one or more of an image capture device such as a camera (an image sensor), and/or the like, and a sensor such as a proximity sensor, an illuminance sensor, and/or the like.

As shown in FIGS. 1A, 1B, and 1C, in the display panel 110 according to aspects of the present disclosure, the display area DA may include one or more optical areas (OA1, OA2) and a normal area NA. Herein, the term "normal area" NA is an area that while being present in the display area DA, does not overlap with one or more optical electronic devices (11, 12) and may also be referred to as a non-optical area. In FIGS. 1A, 1B, and 1C, the one or more optical areas (OA1, OA2) may be one or more areas overlapping the one or more optical electronic devices (11, 12).

According to the example of FIG. 1A, the display area DA may include a first optical area OA1 and a normal area NA.

In this example, at least a portion of the first optical area OA1 may overlap a first optical electronic device 11.

According to the example of FIG. 1B, the display area DA may include a first optical area OA1, a second optical area OA2, and a normal area NA. In the example of FIG. 1B, at least a portion of the normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

According to the example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In some embodiments, an image display structure and a light transmission structure are desirable to be formed in the one or more optical areas (OA1, OA2). For example, since the one or more optical areas (OA1, OA2) are a portion of the display area DA, therefore, the one or more optical areas (OA1, OA2) needs subpixels for displaying an image. Further, to enable light to transmit the one or more optical electronic devices (11, 12), a light transmission structure is needed, and thus is formed in the one or more optical areas (OA1, OA2).

According to embodiments of the present disclosure, even though the one or more optical electronic devices (11, 12) are needed to receive or detect light, the one or more optical electronic devices (11, 12) are sometimes located on the back of the display panel 110 (e.g., on an opposite side of a viewing surface). Thus, in these embodiments, the one or more optical electronic devices (11, 12) are located, for example, under, or in a lower portion of, the display panel 110, and is configured to receive light that has transmitted the display panel 110.

For example, the one or more optical electronic devices (11, 12) are not exposed in the front surface (viewing surface) of the display panel 110. Accordingly, when a user faces the front surface of the display device 110, the one or more optical electronic devices (11, 12) are located so that they are invisible to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit including at least one of the camera lens and the image sensor. The sensor may be, for example, an infrared sensor capable of detecting infrared rays.

In another embodiment, the first optical electronic device 11 may be a sensor, and the second optical electronic device 12 may be a camera. Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit including at least one of the camera lens and the image sensor.

In the example where the first optical electronic device 11 is a camera, the camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1, OA2) included in the display area DA in each of FIGS. 1A, 1B, and 1C are areas where images can be displayed, the normal area NA is an area where a light transmission structure need not be formed, but the one or more optical areas (OA1, OA2) are areas where the light transmission structure need be formed. Thus, in some embodiments, the normal area NA is an area where a light transmission structure is not implemented or included, and the one or more optical areas (OA1, OA2) are areas in which the light transmission structure is implemented or included.

Accordingly, the one or more optical areas (OA1, OA2) may have a transmittance greater than or equal to a predetermined level, i.e., a relatively high transmittance, and the normal area NA may not have light transmittance or have a transmittance less than the predetermined level i.e., a relatively low transmittance.

For example, the one or more optical areas (OA1, OA2) may have a resolution, a subpixel arrangement structure, the number of subpixels per unit area, an electrode structure, a line structure, an electrode arrangement structure, a line arrangement structure, or/and the like different from that/those of the normal area NA.

In an embodiment, the number of subpixels per unit area in the one or more optical areas OA1, OA2 may be less than the number of subpixels per unit area in the normal area NA. For example, the resolution of the one or more optical areas (OA1, OA2) may be lower than that of the normal area NA. Here, the number of pixels per unit area can be measured using pixels per inch (PPI), which represents the number of pixels within 1 inch, as a unit for measuring resolution.

In an embodiment of each of FIGS. 1A, 1B, and 1C, the number of subpixels per unit area in the first optical areas OA1 may be less than the number of subpixels per unit area in the normal area NA. In an embodiment of each of FIGS. 1A, 1B, and 1C, the number of subpixels per unit area in the second optical areas OA2 may be greater than or equal to the number of subpixels per unit area in the first optical areas OA1, and be less than the number of subpixels per unit area in the normal area NA.

In each of FIGS. 1A, 1B, and 1C, the first optical area OA1 may have various shapes, such as a circle, an ellipse, a quadrangle, a hexagon, an octagon or the like. In each of FIGS. 1B, and 1C, the second optical area OA2 may have various shapes, such as a circle, an ellipse, a quadrangle, a hexagon, an octagon or the like. The first optical area OA1 and the second optical area OA2 may have the same shape or different shapes.

As illustrated in FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like. Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

When the display device 100 according to aspects of the present disclosure has a structure in which the first optical electronic device 11 such as a camera, and the like. is located under, or in a lower portion of, the display panel 100 without being exposed to the outside, such a display device 100 according to aspects of the present disclosure may be referred to as a display in which under-display camera (UDC) technology is implemented.

According to this example, in the display device 100 according to aspects of the present disclosure, a reduction of an area or size of the display area DA can be prevented because a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11, 12) are located on the back of (e.g., under, or in a lower portion of) the display panel 110 of the display device 100 (e.g., hidden or not exposed to the outside), in some aspects, the one or more optical electronic devices (11, 12) can perform normal predefined functionalities, and thus, receive or detect light.

Further, in the display device 100 according to aspects of the present disclosure, although one or more optical electronic devices (11, 12) are located on the back of (e.g., under, or in a lower portion of) the display panel 110 to be hidden and located to be overlap the display area DA, it is necessary for image display to be normally performed in the one or more optical areas (OA1, OA2) overlapping the one or more optical electronic devices (11, 12) in the area DA. Thus, in one or more examples, even though one or more optical electronic devices 11 and 12 are located on the back of the display panel, images can be displayed in a normal manner (e.g., without reduction in image quality) in the one or more optical areas OA1 and OA2 overlapping the one or more optical electronic devices 11 and 12 in the area DA.

Figure 2:
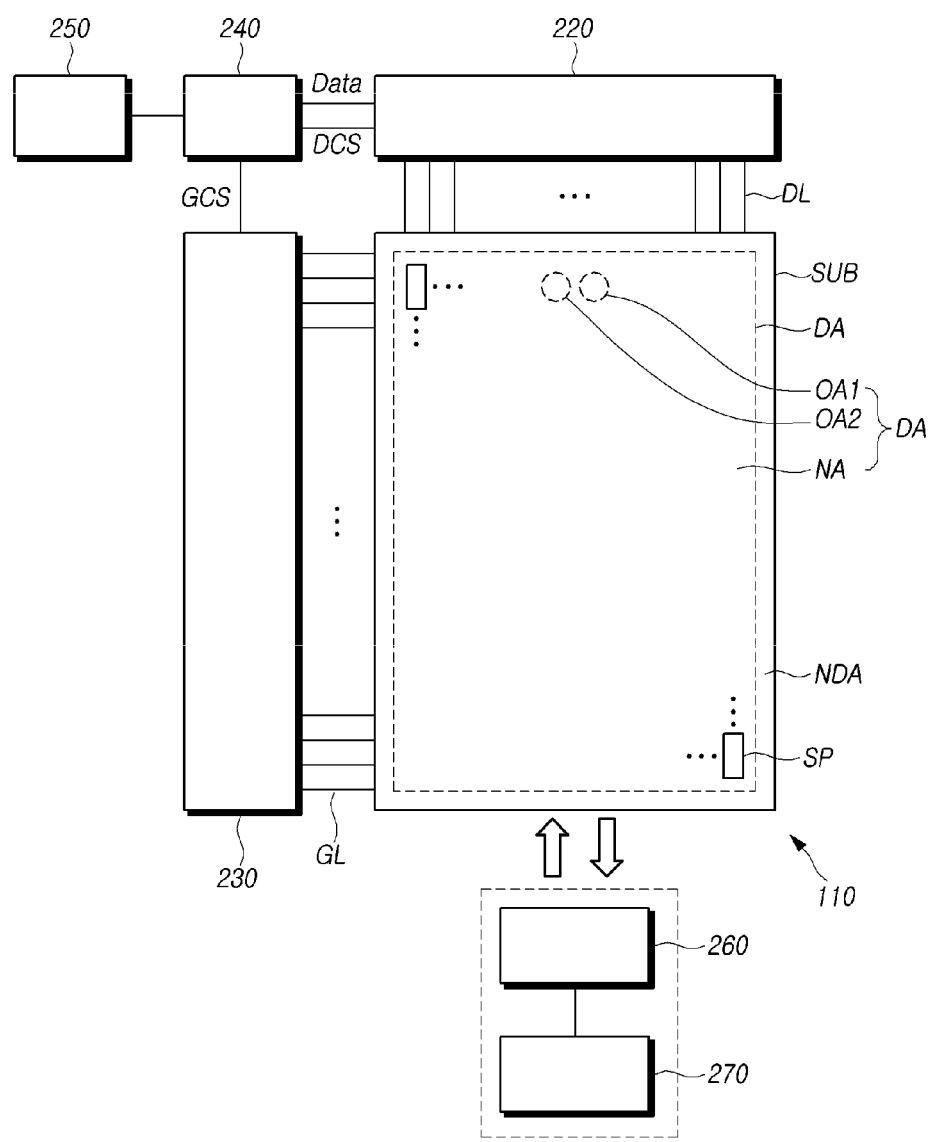
FIG. 2 illustrates an example system configuration of the display device according to aspects of the present disclosure.

FIG. 2 illustrates an example system configuration of the display device 100 according to aspects of the present disclosure.

With reference to FIG. 2, the display device 100 can include the display panel 110 and a display driving circuit as components for displaying an image. The display driving circuit is a circuit for driving the display panel 110, and can include a data driving circuit 220, a gate driving circuit 230, a display controller 240, and other components.

The display panel 110 can include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 can include a substrate SUB and a plurality of subpixels SP disposed on the substrate SUB. The display panel 110 can further include various types of signal lines to drive the plurality of subpixels SP.

The display device 100 according to aspects of the present disclosure may be a liquid crystal display device, or the like, or a self-emission display device in which light is emitted from the display panel 110 itself. When the display device 100 according to aspects of the present disclosure is the self-emission display device, each of the plurality of subpixels SP may include a light emitting element.

In one embodiment, the display device 100 according to aspects of the present disclosure may be an organic light emitting display device in which the light emitting element is implemented using an organic light emitting diode (OLED). For another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of subpixels SP may vary according to types of the display devices 100. For example, when the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like. The plurality of data lines DL and the plurality of gate lines GL may intersect each other. Each of the plurality of data lines DL may extend in a first direction. Each of the plurality of gate lines GL may extend in a second direction. For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 may be a device for controlling the data driving circuit 220 and the gate driving circuit 230, and can control driving timing for the plurality of data lines DL and driving timing for the plurality of gate lines GL. The display controller 240 can supply a data driving control signal DCS to the data driving circuit 220 to control the data driving circuit 220, and supply a gate driving control signal GCS to the gate driving circuit 230 to control the gate driving circuit 230. The display controller 240 can receive input image data from a host system 250 and supply image data Data to the data driving circuit 220 based on the input image data.

The data driving circuit 220 can supply data signals to the plurality of data lines DL according to the driving timing control of the display controller 240. The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to the timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. For example, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

In some embodiments, at least one of the data driving circuit 220 and the gate driving circuit 230 may be disposed in the display area DA of the display panel 110. For example, at least one of the data driving circuit 220 and the gate driving circuit 230 may be disposed not to overlap subpixels SP, or disposed to be overlapped with one or more, or all, of the subpixels SP.

The data driving circuit 220 may also be located on, but not limited to, only one side or portion (e.g., an upper edge or a lower edge) of the display panel 110. In some embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In some embodiments, the gate driving circuit 230 may be connected to two sides or portions (e.g., a left edge and a right edge) of the panel 110, or be connected to at least two of four sides or portions (e.g., an upper edge, a lower edge, the left edge, and the right edge) of the panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In some embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like. The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more predefined interfaces. In some embodiments, such interfaces may include a low voltage differential signaling (LVDS) interface, an EPI interface, a serial peripheral interface (SP), and the like.

To further provide a touch sensing function, as well as an image display function, the display device 100 according to aspects of the present disclosure may include at least one touch sensor, and a touch sensing circuit capable of detecting whether a touch event occurs by a touch object, such as a finger, a pen, or the like, or of detecting a corresponding touch position, by sensing the touch sensor. The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and one or more other components. The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where the add-on type of touch sensor is disposed, the touch panel and the display panel 110 may be separately manufactured and coupled during an assembly process. The add-on type of touch panel may include a touch panel substrate and a plurality of touch electrodes on the touch panel substrate. In the example where the touch sensor is implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data. The touch sensing circuit can perform touch sensing using a self-capacitance sensing method or a mutual-capacitance sensing method. In the example where the touch sensing circuit performs touch sensing in the self-capacitance sensing method, the touch sensing circuit can perform touch sensing based on capacitance between each touch electrode and a touch object (e.g., a finger, a pen, and the like). According to the self-capacitance sensing method, each of the plurality of touch electrodes can serve as both a driving touch electrode and a sensing touch electrode. The touch driving circuit 260 can drive all, or one or more, of the plurality of touch electrodes and sense al, or one or more, of the plurality of touch electrodes. In the example where the touch sensing circuit performs touch sensing in the mutual-capacitance sensing method, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit. The display device 100 according to aspects of the present disclosure may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel 110 may include a normal area NA and one or more optical areas (OA1, OA2), for example, as shown in FIGS. 1A, 1B, and 1C. The normal area NA and the one or more optical areas (OA1, OA2) are areas where an image can be displayed. However, the normal NA is an area in which a light transmission structure need not be implemented, and the one or more optical areas (OA1, OA2) are areas in which the light transmission structure need be implemented.

As discussed above with respect to the examples of FIGS. 1A, 1B, and 1C, although the display area DA of the display panel 110 may include the one or more optical areas (OA1, OA2) in addition to the normal area NA, for convenience of description, in the discussion that follows, it is assumed that the display area DA includes first and second optical areas (OA1, OA2) and the normal area NA; and the normal area NA thereof includes the normal areas NAs in FIGS. 1A to 1C, and the first and second optical areas (OA1, OA2) thereof include the first optical areas OA1s in FIGS. 1A, 1B, and 1C and the second optical areas OA2s of FIGS. 1B and 1C, respectively, unless explicitly stated otherwise.

Figure 3:
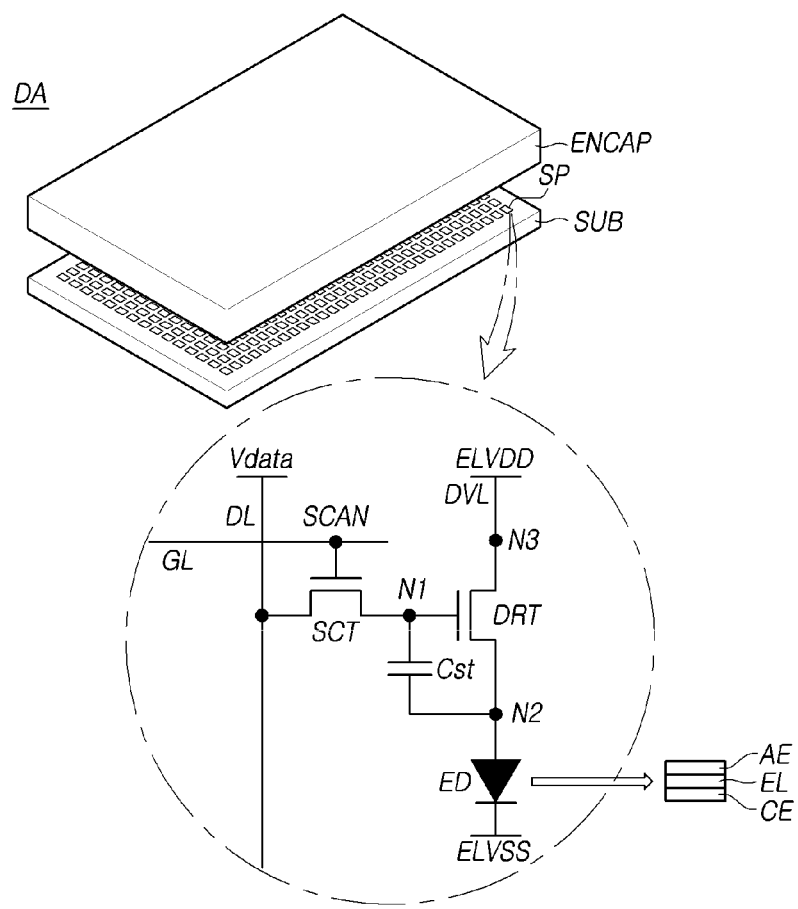
FIG. 3 illustrates an example equivalent circuit of a subpixel in a display panel according to aspects of the present disclosure.

FIG. 3 illustrates an example equivalent circuit of a subpixel SP in the display panel 110 according to aspects of the present disclosure.

Each of subpixels SP disposed in the normal area NA, the first optical area OA1, and the second optical area OA2 included in the display area DA of the display panel 110 may include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like. The driving transistor DRT can include the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED can include an anode electrode AE, an emission layer EL, and a cathode electrode CE. The anode electrode AE may be a pixel electrode disposed in each subpixel SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT. Each subpixel SP may include two transistors (2T: DRT and SCT) and one capacitor (1C: Cst) (which may be referred to as a "2T1C structure") as shown in FIG. 3, and in some cases, may further include one or more transistors, or further include one or more capacitors.

In some embodiments, the storage capacitor Cst, which may be present between the first node Nx and the second node Ny of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like). Each of the driving transistor DRT and the scan transistor SCT may be an n-type transistor or a p-type transistor.

Since circuit elements (e.g., in particular, a light emitting element ED) in each subpixel SP are vulnerable to external moisture or oxygen, an encapsulation layer ENCAP may be disposed in the display panel 110 to prevent the external moisture or oxygen from penetrating into the circuit elements (e.g., in particular, the light emitting element ED). The encapsulation layer ENCAP may be disposed to cover the light emitting element ED.

Figure 4:
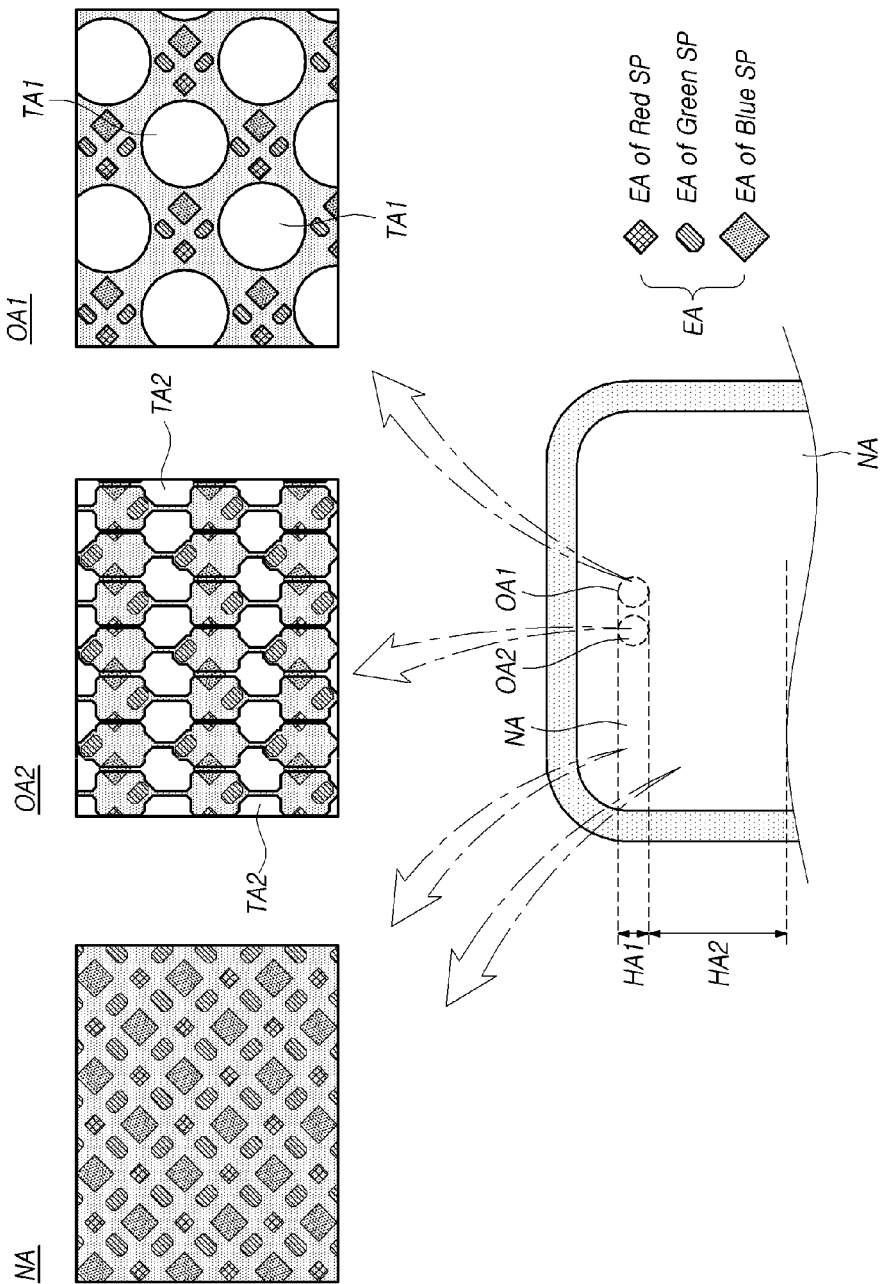
FIG. 4 illustrates example arrangements of subpixels in three areas included in a display area of the display panel according to aspects of the present disclosure.

FIG. 4 illustrates example arrangements of subpixels SP in the three areas (NA, OA1, and OA2) included in the display area DA of the display panel 110 according to aspects of the present disclosure.

With reference to FIG. 4, a plurality of subpixels SP may be disposed in each of the normal area NA, the first optical area OA1, and the second optical area OA2 included in the display area DA. The plurality of subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

With reference to FIG. 4, in some embodiments, the normal area NA may not include a light transmission structure, but may include light emitting areas EA. However, in some embodiments, the first optical area OA1 and the second optical area OA2 need to include both the light emitting areas EA and the light transmission structure. Accordingly, the first optical area OA1 can include light emitting areas EA and first transmission areas TA1, and the second optical area OA2 can include the light emitting areas EA and second transmission area TA2.

The light emitting areas EA and the transmission areas (TA1, TA2) may be distinct according to whether the transmission of light is allowed. For example, the light emitting areas EA may be areas not allowing light to transmit (e.g., not allowing light to transmit to the back of the display panel), and the transmission areas (TA1, TA2) may be areas allowing light to transmit (e.g., allowing light to transmit to the back of the display panel).

The light emitting areas EA and the transmission areas (TA1, TA2) may be also distinct according to whether or not a specific metal layer is included. For example, the cathode electrode CE as shown in FIG. 3 may be disposed in the light emitting areas EA, and the cathode electrode CE may not be disposed in the transmission areas (TA1, TA2). In some embodiments, a light shield layer may be disposed in the light emitting areas EA, and a light shield layer may not be disposed in the transmission areas (TA1, TA2).

Because the first optical area OA1 includes the first transmission areas TA1 and the second optical area OA2 includes the second transmission areas TA2, both of the first optical area OA1 and the second optical area OA2 are areas through which light can pass. In one embodiment, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have a substantially equal shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 may be different. For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have a substantially equal shape or size, a ratio of the first transmission area TA1 to the first optical area OA1 and a ratio of the second transmission area TA2 to the second optical area OA2 may be different from each other.

For example, in the example where the first optical electronic device 11, as shown in FIGS. 1A, 1B and 1C, overlapping the first optical area OA1 is a camera, and the second optical electronic device 12, as shown in FIGS. 1B and 1C, overlapping the first optical area OA1 is a camera, overlapping the second optical area OA2 is a sensor for detecting images, the camera may need a greater amount of light than the sensor. Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have a substantially equal size, a ratio of the first transmission area TA1 to the first optical area OA1 may be greater than a ratio of the second transmission area TA2 to the second optical area OA2.

For convenience of description, the discussion that follows is provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise.

With reference to FIG. 4, a horizontal display area in which the first optical area OA1 and the second optical area OA2 are disposed is referred to as a first horizontal display area HA1 and another horizontal display area in which the first optical area OA1 and the second optical area OA2 are not disposed is referred to as a second horizontal display area HA2.

As shown in FIG. 4, the first horizontal display area HA1 may include a portion of the normal area NA, the first optical area OA1, and the second optical area OA2. The second horizontal display area HA2 may include only another portion of the normal area NA.

Figure 5B:
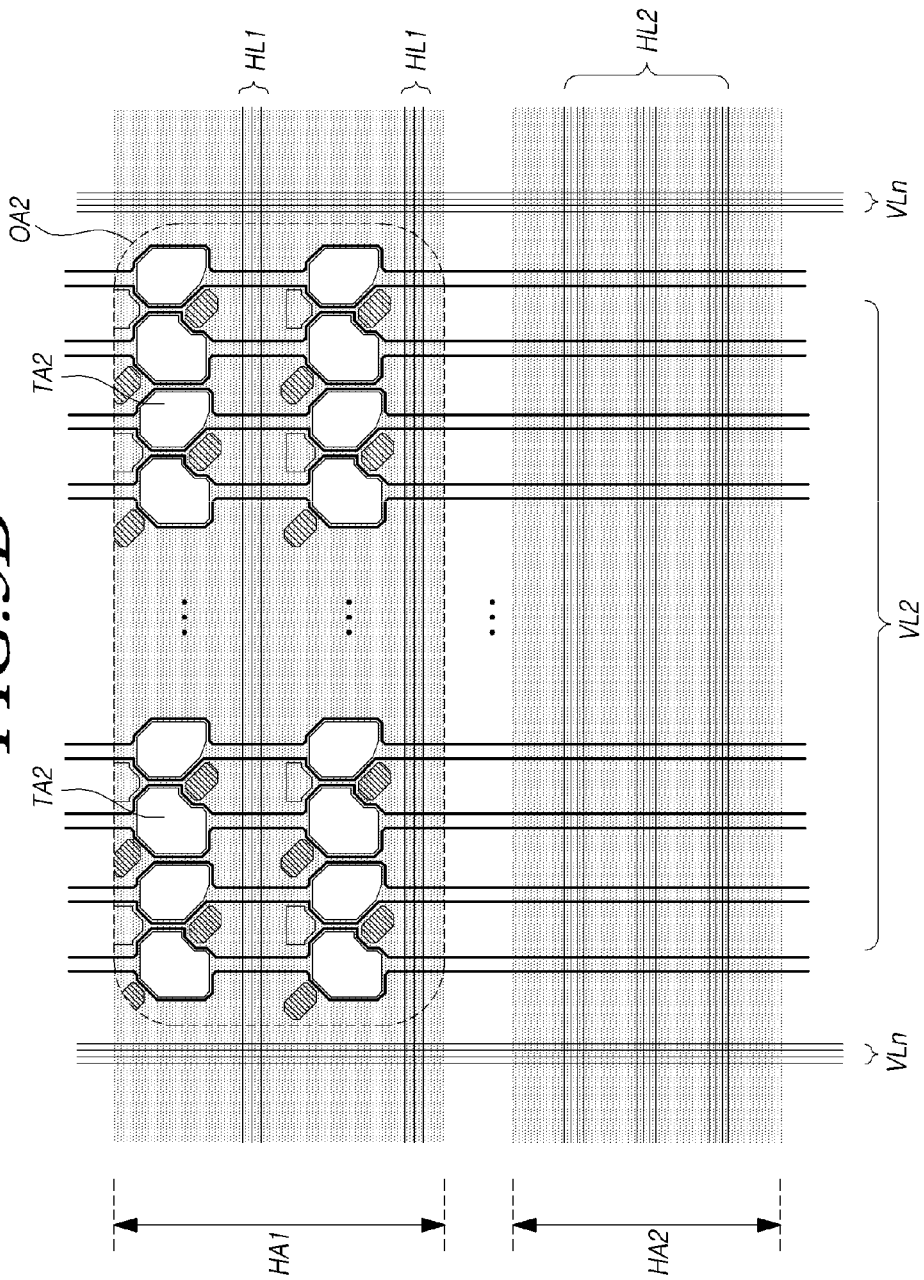
FIG. 5B illustrates example arrangements of signal lines in each of a second optical area and the normal area in the display panel according to aspects of the present disclosure.

FIG. 5A illustrates example arrangements of signal lines in each of the first optical area OA1 and the normal area NA of the display panel 110 according to aspects of the present disclosure, and FIG. 5B illustrates example arrangements of signal lines in each of the second optical area OA2 and the normal area NA of the display panel 110 according to aspects of the present disclosure.

First horizontal display areas HA1 shown in FIGS. 5A and 5B are portions of the first horizontal display area HA1 of the display panel 110, and second horizontal display areas HA2 therein are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

As illustrated in FIGS. 5A and 5B, the first horizontal display area HA1 may include a portion of the normal area NA, the first optical area OA1, and the second optical area OA2. The second horizontal display area HA2 may include another portion of the normal area NA.

Various types of horizontal lines (HL1, HL2) and various types of vertical lines (VLn, VL1, VL2) may be disposed in the display panel 11.

In some embodiments, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL is disposed to extend and, and the vertical direction may refer to, for example, a direction in which one data line DL is disposed to extend. As such, the term horizontal and the term vertical are used to represent two directions.

As illustrated in FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. For example, the first horizontal lines HL1 and the second horizontal lines HL2 may be the gate lines GL. The gate lines GL may include various types of gate lines according to structures of one or more subpixels SP.

As shown in FIGS. 5A and 5B, the vertical lines disposed in the display panel 110 may include typical vertical lines VLn disposed only in the normal area NA, first vertical lines VL1 running through both of the first optical area OA1 and the normal area NA, second vertical lines VL2 running through both of the second optical area OA2 and the normal area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some embodiments, it should be noted that the term "horizontal" in the second horizontal line HL2 may mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the typical vertical line VLn may mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, one or more of the typical vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

With reference to FIG. 5A, the first optical area OA1 included in the first horizontal area HA1 may include light emitting areas EA, as shown in FIG. 4, and first transmission areas TA1. In the first optical area OA1, respective outer areas of the first transmission areas TA1 may include corresponding light emitting areas EA.

As shown in FIG. 5A, in order to improve the transmittance of the first optical area OA1, the first horizontal lines HL1 may run through the first optical area OA1 while avoiding the first transmission areas TA1 in the first optical area OA1. Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. For example, the first horizontal lines HL1 running through the first optical area OA1 and the second horizontal lines HL2 not running through the first optical area OA1 may have different shapes or lengths.

Further, to improve the transmittance of the first optical area OA1, the first vertical lines VL1 may run through the first optical area OA1 while avoiding the first transmission areas TA1 in the first optical area OA1. Accordingly, each of the first vertical lines VL1 running through the first optical area OA1 may include one or more curved or bent portions running around one or more respective outer edges of one or more of the first transmission areas TA1. Thus, the first vertical lines VL1 running through the first optical area OA1 and the typical vertical lines VLn disposed in the normal area NA without running through the first optical area OA1 may have different shapes or lengths.

As shown in FIG. 5A, the first transmission areas TA1 included in the first optical area OA1 in the first horizontal area HA1 may be arranged in a diagonal direction. In the first optical area OA1 in the first horizontal area HAL one or more light emitting areas EA may be disposed between two horizontally adjacent first transmission areas TA1. In the first optical area OA1 in the first horizontal area HAL one or more light emitting areas EA may be disposed between two vertically adjacent first transmission areas TA1. Each of the first horizontal lines HL1 disposed in the first horizontal area HA1 (e.g., each of the first horizontal lines HL1 running through the first optical area OA1) may include one or more curved or bent portions running around one or more respective outer edges of one or more of the first transmission areas TA1.

With reference to FIG. 5B, the second optical area OA2 included in the first horizontal area HA1 may include light emitting areas EA and second transmission areas TA2. In the second optical area OA2, respective outer areas of the second transmission areas TA2 may include corresponding light emitting areas EA.

In one embodiment, the light emitting areas EA and the second transmission areas TA2 in the second optical area OA2 may have locations and arrangements substantially equal to the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A. For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom or bottom to top direction). For example, one or more light emitting areas EA may be disposed between two rows of second transmission areas.

When in the first horizontal area HAL running through the second optical area OA2 and the normal area NA adjacent to the second optical area OA2, in one embodiment, the first horizontal lines HL1 may have substantially the same arrangement as the first horizontal lines HL1 of FIG. 5A.

In another embodiment, as shown in FIG. 5B, when in the first horizontal area HAL running through the second optical area OA2 and the normal area NA adjacent to the second optical area OA2, the first horizontal lines HL1 may have an arrangement different from the first horizontal lines HL1 of FIG. 5A. This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

As illustrated in FIG. 5B, when in the first horizontal area HAL the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion. For example, one first horizontal line HL1 may have one or more curved or bent portions in the first optical area OA1, but may not have a curved or bent portion in the second optical area OA2.

To improve the transmittance of the second optical area OA2, the second vertical lines VL2 may run through the second optical area OA2 while avoiding the second transmission areas TA2 in the second optical area OA2. Accordingly, each of the second vertical lines VL2 running through the second optical area OA2 may include one or more curved or bent portions running around one or more respective outer edges of one or more of the second transmission areas TA2. Thus, the second vertical lines VL2 running through the second optical area OA2 and the typical vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

With reference to FIGS. 5A and 5B, according to an example light transmitting structure, the first optical area OA1 that at least partially overlaps the first optical electronic device 11 includes the first transmission areas TA1, and the second optical area OA2 that at least partially overlaps with the second optical electronic device 12 includes the second transmission areas TA2. Therefore, the number of subpixels per unit area in each of the first optical area OA1 and the second optical area OA2 may be less that of than the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be less than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, because the number (the first number) of subpixels connected to each, or one or more, of the first horizontal lines HL1 running through the first optical area OA1 and the second optical area OA2 is less than the number of subpixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is greatly smaller than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 6:
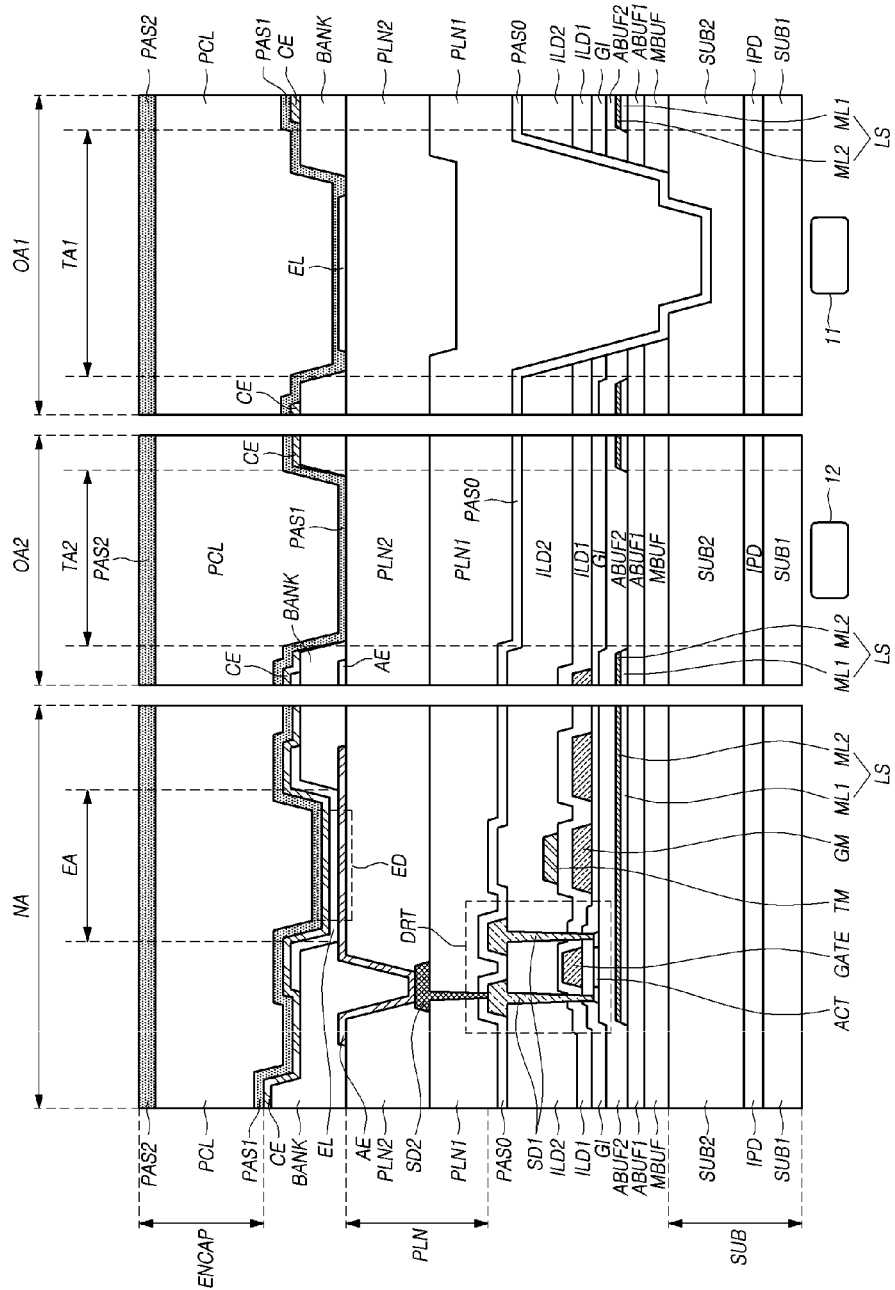
FIGS. 6 and 7 are example cross-sectional views of the normal area, the first optical area, and the second optical area included in the display area of the display panel according to aspects of the present disclosure.
Figure 7:
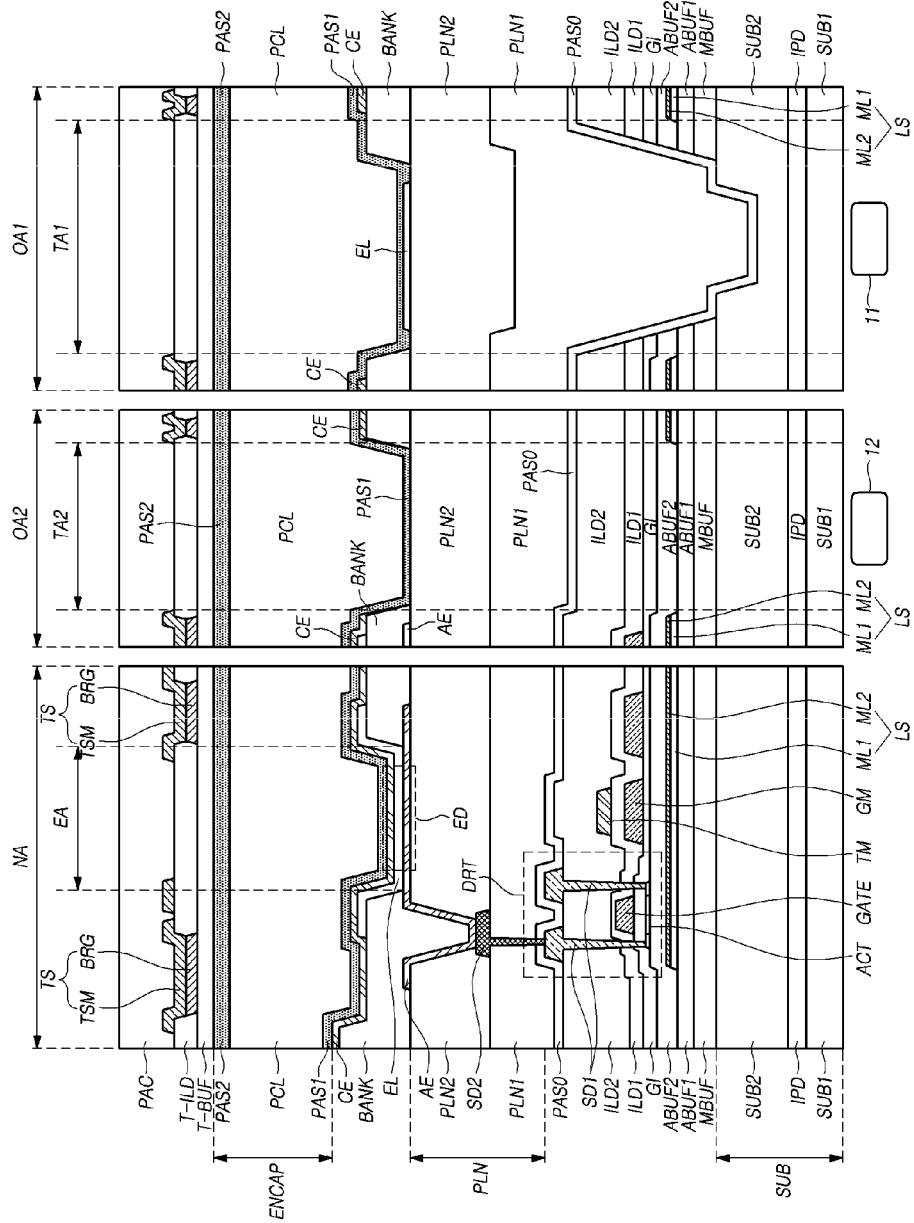

FIGS. 6 and 7 are example cross-sectional views of the normal area, the first optical area, and the second optical area included in the display area of the display panel according to aspects of the present disclosure.

FIG. 6 shows the display panel 110 in an example where a touch sensor is implemented outside of the display panel 110 in the form of a touch panel, and FIG. 7 shows the display panel 110 in an example where a touch sensor TS is implemented inside of the display panel 110. Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA included in the first optical area OA1 and the second optical area OA2 may have the same stack structure as the normal area NA or a light emitting area EA in the normal area NA.

With reference to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

With reference to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

With reference to FIGS. 6 and 7, a multi-buffer layer MBUF may be disposed on the second substrate SUB2, and a first active buffer layer ABUF1 may be disposed on the multi-buffer layer MBUF. A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2. A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formatted. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planarization layer PLN may be disposed on the passivation layer PAS0. The planarization layer PLN may include a first planarization layer PLN1 and a second planarization layer PLN2. The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According to an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the subpixel SP may be opened. A portion of the anode electrode AE may be exposed through the opening (the opened portion) of the bank BANK. An emission layer EL may be located on side surfaces of the bank BANK and in the opening (the opened portion) of the bank BANK. All or at least a portion of the emission layer EL may be located between adjacent banks. In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic material layer.

An encapsulation layer ENCAP may be disposed on the stack of the light emitting element ED. The encapsulation layer ENCAP may have a single-layer structure or a multi-layer structure For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride ($SiN_x$), silicon oxide ($SiO_x$), silicon oxynitride (SiON), aluminum oxide ($Al_2O_3$), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can reduce or prevent external moisture or oxygen from penetrating into the first encapsulation layer PAS1 and the second encapsulation layer PCL. For example, the third encapsulation layer PAS2 may include an inorganic insulating material, such as silicon nitride ($SiN_x$), silicon oxide ($SiO_x$), silicon oxynitride (SiON), aluminum oxide ($Al_2O_3$), or the like.

With reference to FIG. 7, in an example where a touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF. The touch sensor TS may include touch sensor metals TSM and at least one bridge metal BRG, which are located in different layers. A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

To prevent damage to the emission layer EL including an organic material, which is vulnerable to high temperatures, the touch buffer layer T-BUF can be formed at a low temperature less than or equal to a predetermined temperature (e.g. 100 degrees (° C.)) and be formed using an organic insulating material having a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

The light emitting area EA of the first optical area OA1 may have the same stack structure as that in the normal area NA. Accordingly, in the discussion that follows, instead of repeatedly describing the light emitting area EA in the first optical area OA1, a stack structure of the first transmission area TA1 in the first optical area OA1 will be described in detail below.

In some embodiments, the cathode electrode CE may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Further, referring to FIGS. 6 and 7, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement.

Further, in accordance with FIG. 7, in some embodiments, the touch sensor metal TSM and the bridge metal BRG included in the touch sensor TS may not be disposed in the first transmission area TA1 in the first optical area OA1. Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel 110 of the display device 100 according to aspects of the present disclosure, a transmittance improvement structure TIS can be provided to the first transmission area TA1 in the first optical area OA1.

With reference to FIGS. 6 and 7, the plurality of insulating layers included in the display panel 110 may include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

As shown in FIG. 7, the plurality of insulating layers included in the display panel 110 may further include the touch buffer layer T-BUF and the touch interlayer insulating layer T-ILD located on the encapsulation layer ENCAP, and the like. The first transmission area TA1 in the first optical area OA1 can have a structure in which the first planarization layer PLN1 and the passivation layer PAS0 have depressed portions that extend downward from respective surfaces thereof as a transmittance improvement structure TIS. Among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

As shown in FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2. The substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated. The first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof. The second encapsulation layer PCL may be, for example, an organic insulating layer.

To protect the touch sensor TS, the protective layer PAC may be disposed to cover the touch sensor TS on the encapsulation layer ENCAP. The protective layer PAC may have at least one depression (e.g., a recess, a trench, a concave portion, a protrusion, or the like) as a transmittance improvement structure TIS in a portion overlapping the first transmission area TA1. The protective layer PAC may be, for example, an organic insulating layer.

The touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the subpixel SP. In order for the first optical area OA1 to have a transmittance higher than the normal area NA, an area or size of the touch sensor metal TSM per unit area in the first optical area OA1 may be smaller than an area or size of the touch sensor metal TSM per unit area in the normal area NA.

In accordance with FIG. 7, in some embodiments, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

As shown in FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below. In some embodiments, the cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE. Further, in some embodiments, a light shield layer LS including at least one of the first metal layer ML1 and the second metal layer ML2 may be disposed in the light emitting areas EA included in the normal area NA and the second optical area OA2, but may not be disposed in the first transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1. In another example where the transmittance of the second optical area OA2 and the transmittance of the first optical area OA1 are different, the stack structure of the second transmission area TA2 in the second optical area OA2 may be different at least in part from as the stacked structure of the first transmission area TA1 in the first optical area OA1. For example, as shown in FIGS. 6 and 7, in some embodiments, when the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. Further, a width of the second transmission area TA2 in the second optical area OA2 may be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 in the second optical area OA2 equally, substantially equally, or similarly. However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, all, or one or more, of the metal material layers (ML1, ML2, GATE, GM, TM, SD1, SD2) related to at least one transistor and the semiconductor layer ACT may not be disposed in the second transmission area TA2 in the second optical area OA2. Further, in some embodiments, the anode electrode AE and the cathode electrode CE included in the light emitting element ED may not be disposed in the second transmission area TA2. In some embodiments, the emission layer EL of the light emitting element ED may or may not be disposed on the second transmission area TA2 according to a design requirement. Further, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
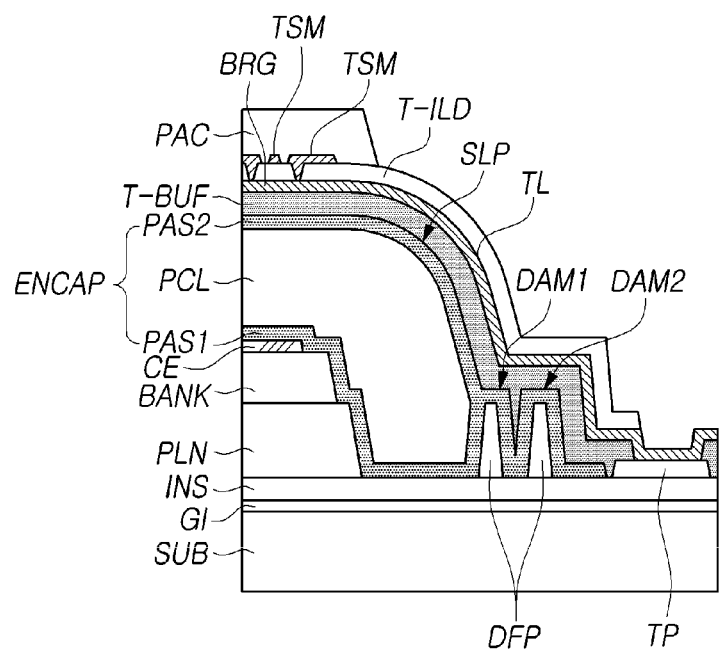
FIG. 8 is an example cross-sectional view in an outer edge of the display panel according to aspects of the present disclosure.

FIG. 8 is an example cross-sectional view in an outer edge of the display panel according to aspects of the present disclosure.

Figure 9:
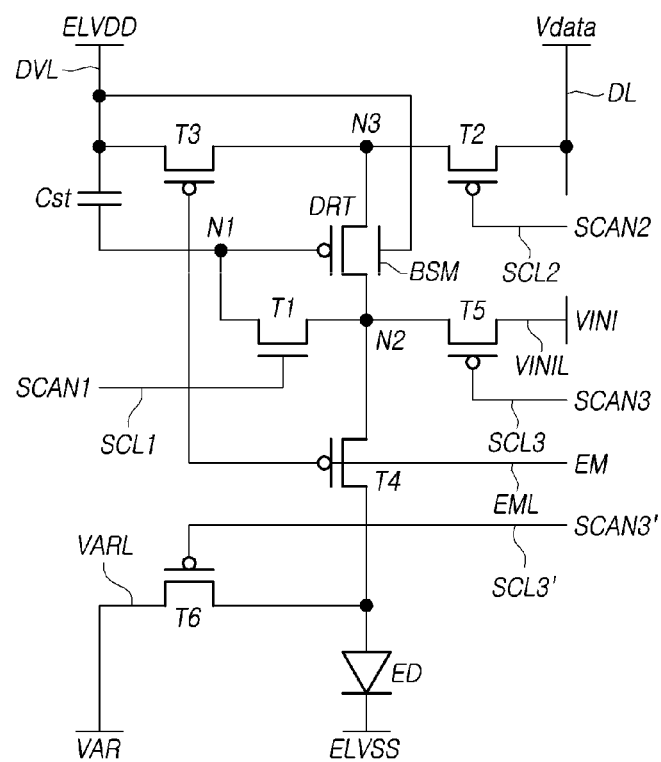
FIG. 9 illustrates an example pixel circuit of the display device according to aspects of the present disclosure.

For the sake of brevity, in FIG. 8, a single substrate SUB including the first substrate SUB1 and the second substrate SUB2 is illustrated, and layers or portions located under the bank BANK are illustrated in a simplified manner. Likewise, FIG. 9 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

As shown in FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can reduce or prevent external moisture or oxygen from penetrating into the first encapsulation layer PAS1 and the second encapsulation layer PCL.

As shown in FIG. 8, to prevent the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1, DAM2) may be present at, or near to, a boundary point between the display area DA and the non-display area NDA. The one or more dams (DAM1, DAM2) may include the same material DFP as the bank BANK.

In one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1, DAM2). In another embodiment, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the secondary dam DAM2.

As shown in FIG. 8, a touch pad TP, to which the touch driving circuit 260, as shown in FIG. 2, is electrically connected, may be disposed on a portion of the substrate SUB outside of the one or more dams (DAM1, DAM2). A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP. The touch line TL may run downward along the inclined surface SLP of the encapsulation layer ENCAP, run along the respective upper portions of the dams (DAM1, DAM2), and extend up to the touch pad TP disposed outside of the dams (DAM1, DAM2). In one embodiment, the touch line TL may be the bridge metal BRG. In another embodiment, the touch line TL may be the touch sensor metal TSM.

FIG. 9 illustrates an example pixel circuit of the display device 100 according to aspects of the present disclosure.

As shown in FIG. 9, in some embodiments, the display device 100 can include a plurality subpixels SP, and each of the subpixels SP may include a light emitting element ED, a driving transistor DRT, a first transistor T1, a second transistor T2, a third transistor T3, a fourth transistor T4, a fifth transistor T5, a sixth transistor T6, a storage capacitor Cst, and the like.

The elements included in the pixel circuit will be described with reference to FIG. 9.

The light emitting element ED can include an anode electrode AE, an emission layer EL, and a cathode electrode CE. The driving transistor DRT may include a first node N1, a second node N2, and a third node N3, and may be a transistor for driving the light emitting element ED.

The first transistor T1 can be controlled by a first scan signal SCAN1 and control a connection between the first node N1 and the second node N2. The second transistor T2 can be controlled by a second scan signal SCAN2 and control a connection between the third node N3 and a data line DL. A data voltage Vdata may be applied to the data line DL. The third transistor T3 can be controlled by an emission control signal EM and control a connection between the third node N3 and a driving voltage line DVL. A driving voltage ELVDD may be applied to the driving voltage line DVL. The fourth transistor T4 can be controlled by the emission control signal EM and control a connection between the anode electrode AE and the second node N2. The fifth transistor T5 can be controlled by a third scan signal SCAN3 and control a connection between an initialization signal line VINIL and the second node N2. An initialization voltage VINI for initializing the voltage of the second node N2 or the first node N1 may be applied to the initialization signal line VINIL. The sixth transistor T6 can control a connection between an anode reset voltage line VARL and the anode electrode AE. An anode reset voltage VAR for resetting the voltage of the anode electrode AE of the light emitting element ED may be applied to the anode reset voltage line VARL.

The storage capacitor Cst may be connected between the first node N1 and the driving voltage line DVL.

With reference to FIG. 9, example connections between the pixel circuit and signal lines will be described.

The first scan signal SCAN1 may be applied to the gate node of the first transistor T1 through a first scan line SCL1. For example, the gate node of the first transistor T1 may be electrically connected to the first scan line SCL1.

The second scan signal SCAN2 may be applied to the gate node of the second transistor T2 through a second scan line SCL2. The gate node of the second transistor T2 may be electrically connected to the second scan line SCL2.

The third scan signal SCAN3 may be applied to the gate node of the fifth transistor T5 through a third scan line SCL3. The gate node of the fifth transistor T5 may be electrically connected to the third scan line SCL3.

The emission control signal EM may be commonly applied to respective gate nodes of the third transistor T3 and the fourth transistor T4 through an emission control line EML. For example, the respective gate nodes of the third transistor T3 and the fourth transistor T4 may be commonly connected to the emission control line EML.

In accordance with FIG. 9, another third scan signal SCAN3' different from the third scan signal SCAN3 applied to the gate node of the fifth transistor T5 may be applied to the gate node of the sixth transistor T6. The another third scan signal SCAN3' applied to the gate node of the sixth transistor T6 may be a third scan signal SCAN3 applied to the gate node of another fifth transistor T5 of another subpixel SP. The another third scan signal SCAN3' applied to the gate node of the sixth transistor T6 may be different from the third scan line SCL3 connected to the gate node of the fifth transistor T5. For example, the another third scan signal SCAN3' applied to the gate node of the sixth transistor T6 may be a third scan signal SCAN3 applied to the gate node of another fifth transistor T5 of another subpixel SP.

In one embodiment, all of the seven transistors (DRT, and T1 to T6) included in each subpixel SP may be p-type transistors or n-type transistors. In another embodiment, at least one of the seven transistors (DRT, and T1 to T6) may be a p-type or n-type transistor, and the remaining transistors may be n-type or p-type transistors. For example, as shown in FIG. 9, among the seven transistors (DRT, T1 to T6), the first transistor T1 may be an n-type transistor, and the remaining six transistors (DRT, and T2 to T6) may be p-type transistors.

As shown in FIG. 9, in the display device 100 according to aspects of the present disclosure, the display panel 110 may further include a shield metal BSM disposed under the driving transistor DRT of each subpixel SP. The shield metal BSM may be disposed such that the shield metal BSM avoids a plurality of first transmission areas TA1 in the first optical area OA1. This enables light transmittance of the plurality of first transmission areas TA1 of the first optical area OA1 not to be lowered, and the channel of the driving transistor DRT to be protected.

As shown in FIG. 9, the shield metal BSM may be electrically connected to the driving voltage line DVL. Accordingly, stability of the driving of the driving transistor DRT, for example, in relation to a body effect, can be improved. The shield metal BSM of FIG. 9 may correspond to the light shield layers LS of FIGS. 6 and 7.

Hereinafter, an example arrangement structure of first horizontal lines HL1 among signal lines running through the first optical area OA1 will be described. The first horizontal lines HL1 running through the first optical area OA1 may also run through the second optical area OA2. Hereinafter, for convenience of description, an arrangement structure of the first horizontal lines disposed in the first optical area OA1 will be described. However, it should be noted that the arrangement structure of the first horizontal lines in the first optical area OA1 may be substantially equally applied to the arrangement structure of the first horizontal lines in the second optical area OA2. It should be, therefore, understood that the scope of the present disclosure includes embodiments where the first horizontal lines are disposed in the second optical area OA2.

Figure 10:
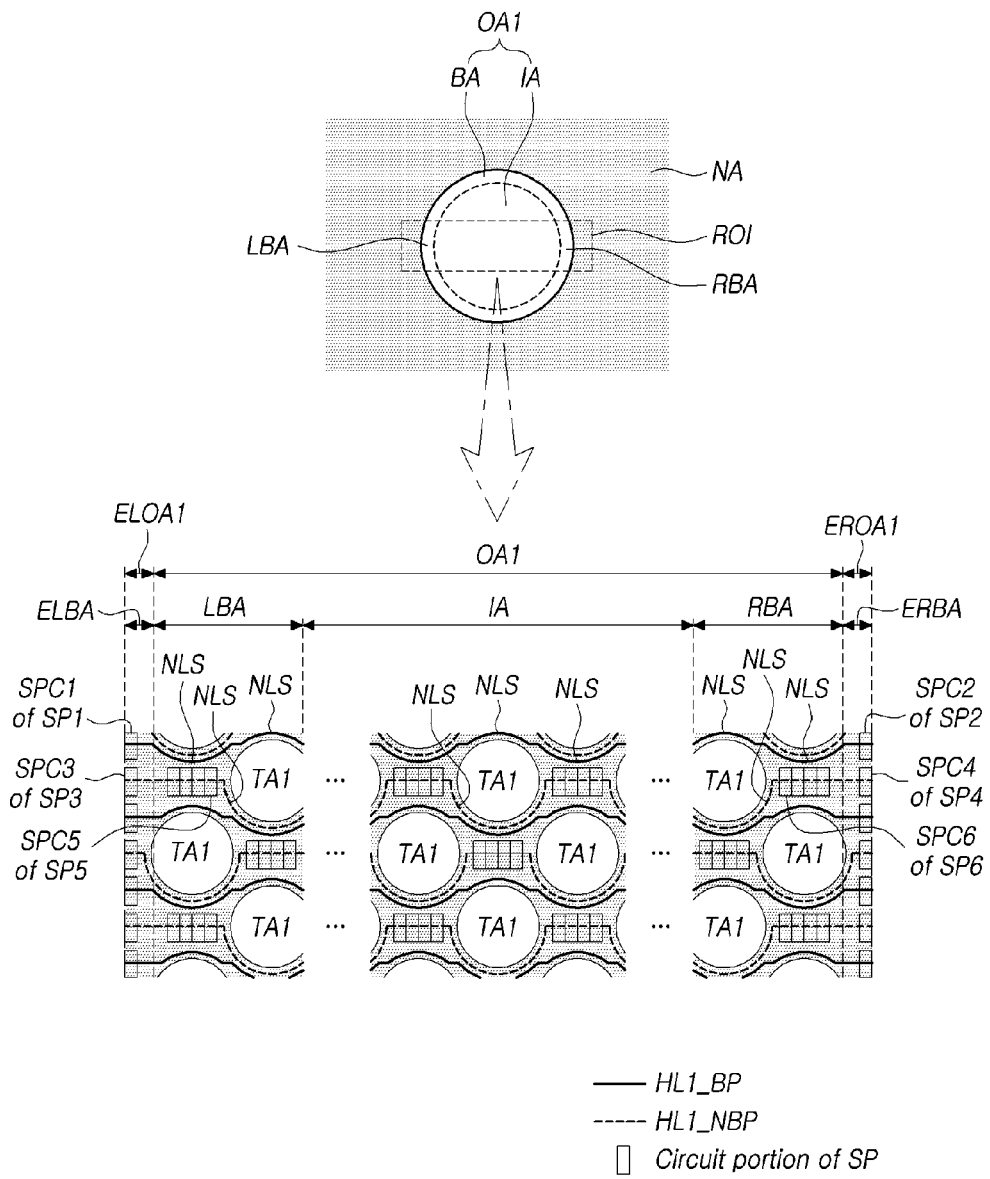
FIG. 10 illustrates an example first optical area of the display device according to aspects of the present disclosure.

FIG. 10 illustrates an example first optical area OA1, as shown in the first optical area OA1 of the foregoing figures, of the display device 100 according to aspects of the present disclosure.

As described above, the display panel 110 of the display device 100 according to aspects of the present disclosure can include a display area DA and a non-display area NDA, and include a plurality of subpixels SP and a plurality of signal lines. Further, the display area DA of the display panel 110 may include the first optical area OA1 and the normal area NA located outside of the first optical area OA1. The first optical area OA1 may include a plurality of first transmission areas TA1.

In the first optical area OA1, a plurality of subpixels SP may be disposed in an area except for the plurality of first transmission areas TA1. This may be expressed such that the first optical area OA1 includes a plurality of light emitting areas EA located outside of the plurality of first transmission areas TA1.

A plurality of subpixels SP may be disposed in the normal area NA. Accordingly, the normal area NA may include a plurality of light emitting areas EA.

As described above, the first optical electronic device 11 may be located under, or in a lower portion of, the display panel 110 and overlap at least a portion of the first optical area OA1 included in the display area DA.

With reference to FIG. 10, for example, the first optical area OA1 may include an inner area IA and a bezel area BA. The bezel area BA may be a donut-shaped area surrounding the inner area IA. The bezel area BA may be a boundary between the inner area IA and the normal area NA.

A plurality of first transmission areas TA1 may be present in the bezel area BA and the inner area IA included in the first optical area OA1. The bezel area BA may have the same structure (e.g., the same subpixel arrangement, and/or the same line arrangement) as the inner area IA. In another embodiment, the bezel area BA may have a different structure (e.g., a different subpixel arrangement, and/or a different line arrangement) from the normal area NA and the inner area IA. For example, the bezel area BA may have a higher resolution (the number of subpixels per unit area) than the inner area IA, and a lower resolution than the normal area NA.

As shown in FIG. 10, an example area ROI including a partial area of the first optical area OA1 in the horizontal direction may include the inner area IA, a first bezel area LBA, which is a bezel area BA located on a first side (left side) of the inner area IA, and a second bezel area RBA, which is a bezel area BA located on a second side (right side) of the inner area IA.

The display area DA may further include one or more extension areas (ELOA1, EROA1) surrounding the first optical area OA1. The extension areas (ELOA1, EROA1) may be donut-shaped areas, and may be included in the first optical area OA1 and/or the normal area NA.

Subpixels SP located in the extension areas (ELOA1, EROA1) may have an arrangement structure equal or similar to subpixels SP located in the normal area NA. In one embodiment, the number of subpixels per unit area in the extension areas (ELOA1, EROA1) may be substantially the same as the number of subpixels per unit area in the normal area NA.

In another embodiment, the subpixels SP located in the extension areas (ELOA1, EROA1) may have an arrangement structure equal or similar to subpixels SP located in the bezel areas BA (LBA, RBA) of the first optical area OA1. For example, the number of subpixels per unit area in the extension areas (ELOA1, EROA1) may be substantially the same as the number of subpixels per unit area in the bezel areas BA (LBA, RBA) of the first optical area OA1.

As illustrated in FIG. 10, the extension areas (ELOA1, EROA1) may be referred to as extended bezel areas (ELBA, ERBA) in which the bezel areas BA are extended.

In some embodiments, in the display panel 110 of the display device 100, the number of subpixels per unit area in the first optical area OA1 may be different from the number of subpixels per unit area in the normal area NA. Each of one or more first horizontal lines HL1 running through the first optical area OA1 may include a portion disposed in the first optical area OA1 and a portion disposed in the normal area NA.

Since the number of subpixels per unit area in the first optical area OA1 is different from the number of subpixels per unit area in the normal area NA, the number of subpixels per unit area connected to one first horizontal line HL1 in the first optical area OA1 may be different from the number of subpixels per unit area connected to one first horizontal line HL1 in the normal area NA. The number of subpixels per unit area connected to one first horizontal line HL1 in the first optical area OA1 may be less than the number of subpixels per unit area connected to one first horizontal line HL1 in the normal area NA.

Further, one or more first horizontal lines HL1 running through the first optical area OA1 may be disposed to avoid first transmission areas TA1 included in the first optical area OA1. Accordingly, the lowering of an intended transmittance of the first transmission areas TA1 can be prevented.

In some embodiments, one or more first horizontal lines HL1 running through the first optical area OA1 may be disposed based on a specific arrangement structure designed taking account of the above-discussed characteristics.

As shown in FIG. 10, in some embodiments, since one or more first horizontal lines HL1 running through the first optical area OA1 are desired to be disposed to avoid first transmission areas TA1 included in the first optical area OA1, the first horizontal lines HL1 may be bent according to an outer shape of the first transmission areas TA1. In this manner, in the first optical area OA1, the one or more first horizontal lines HL1 may have one or more non-linear portions NLS. The non-linear portion NLS may have, for example, an arc shape or a curved shape.

In some embodiments, as the first transmission areas TA1 included in the first optical area OA1 are disposed in a diagonal direction, and the first horizontal lines HL1 are disposed to avoid the first transmissive areas TA1, one or more non-linear portions NLS of each of two first horizontal lines HL1 may be located in a zigzag pattern. In some embodiments, the display panel 110 may include a first subpixel SP1 and a second subpixel SP2 among the plurality of subpixels SP.

The first subpixel SP1 may be located near the left boundary of the first optical area OA1 (e.g., in a first extended bezel area ELBA of the example of FIG. 10). The second subpixel SP2 may be located near the right boundary of the first optical area OA1 (e.g., in a second extended bezel area ERBB of the example of FIG. 10), and located to be spaced from the first subpixel SP1 in the horizontal direction. Each of the plurality of subpixels SP may receive S types of signals. Here, S may be a natural number of 2 or more.

In some embodiments, the display panel 110 of the display device 100 may include a plurality of first horizontal lines HL1 running through the first optical area OA1 among the plurality of signal lines.

In accordance with FIG. 10, in some embodiments, one or more first horizontal lines HL1_BP of the plurality of first horizontal lines HL1 running through the first optical area OA1 may bypass (i.e., without being connected to) one or more other subpixels between the first subpixel SP1 and the second subpixel SP2, while being connected to a first circuit portion SPC1 of the first subpixel SP1 and a second circuit portion SPC2 of the second subpixel SP2. Such one or more first horizontal lines HL1_BP may be referred to as a bypass line HL1_BP. For example, the one or more bypass line HL1_BP may serve to carry one or more specific signals. A specific signal may be, for example, the second scan signal SCAN2 of FIG. 9.

In some embodiments, one or more first horizontal lines HL1_NBP, which are different from the bypass line HL1_BP, of the plurality of first horizontal lines HL1 running through the first optical area OA1 may be connected to one or more subpixels SP inside of the first optical area OA1. Such one or more first horizontal lines HL1_NBP may be referred to as a non-bypass line HL1_NBP.

In some embodiments, the display panel 110 of the display device 100 may further include a third subpixel SP3, a fourth subpixel SP4, a fifth subpixel SP5, and a sixth subpixel SP6 among the plurality of subpixels SP. The third subpixel SP3 may be located near the left boundary of the first optical area OA1 (e.g., the first extended bezel area ERBA of the example of FIG. 10), and located to be spaced from the first subpixel SP1 in the vertical direction. The fourth subpixel SP4 may be located near the right boundary of the first optical area OA1 (e.g., the second extended bezel area ERBB of the example of FIG. 10), and located to be spaced from the second subpixel SP2 in the vertical direction. The fifth subpixel SP5 and the sixth subpixel SP6 may be located inside of the first optical area OA1 and located between the third subpixel SP3 and the fourth subpixel SP4.

In some embodiments, the one or more first horizontal lines HL1_NBP that are the non-bypass lines may be connected to a third circuit portion SPC3 of the third subpixel SP3, a fourth circuit portion SPC4 of the fourth subpixel SP4, a fifth circuit portion SPC5 of the fifth subpixel SP5, and a sixth circuit portion SPC6 of the sixth subpixel SP6.

In accordance with FIG. 10, in one embodiment, in the display panel 110 of the display device 100, all of the plurality of first horizontal lines HL1 may be located in the same layer. In another embodiment, at least one of the plurality of first horizontal lines HL1 may be located in a different layer from the remaining first horizontal lines HL1.

With reference to FIG. 10, in some embodiments, in the display panel 110 of the display device 100, the plurality of first horizontal lines HL1 may be disposed to avoid a plurality of first transmission areas TA1 of the first optical area OA1. For example, directions or patterns configured or provided in each of the plurality of first horizontal lines HL1 to avoid the plurality of first transmission areas TA1 may alternate in a zigzag shape.

Each bypass line HL1_BP may avoid the plurality of first transmission areas TA1 in a manner that bypasses the first transmission areas TA1 in alternate first and second directions opposite to each other. Each non-bypass line HL1_NBP may avoid the plurality of first transmission areas TA1 in a manner that bypasses the first transmission areas TA1 in the first or second direction.

For example, the bypass line HL1_BP may avoid the first transmission areas TA1 in a manner that alternates between upper portions of some first transmission areas TA1 and lower portions of other first transmission areas TA1. The non-bypass line HL1_NBP may avoid the first transmission areas TA1 in a manner that bypasses upper portions of some first transmission areas TA1 or lower portions of other first transmission areas TA1.

For example, one or more non-linear portions NLS of each of the bypass lines HL1_BP may include one or more first non-linear portions NLS bypassing one or more lower portions of one or more first transmission areas TA1 and/or one or more second non-linear portions NLS bypassing one or more upper portions of one or more first transmission areas TA1.

For example, the one or more non-linear portions NLS of each of the bypass lines HL1_BP may be located adjacent to one another in the diagonal direction. The one or more non-linear portions NLS of each of the non-bypass lines HL1_NBP may be located adjacent to one another in the diagonal direction.

Subpixels SP disposed in the first optical area OA1 may be disposed adjacent to one another on a predefined number basis. In the example of FIG. 10, four subpixels SP may be disposed adjacent to one another in the first optical area OA1. The light emitting areas EA of the four adjacent subpixels SP in the first optical area OA1 may be disposed adjacent to one another in the diagonal direction, as shown in the figures including FIG. 4 described above. In these examples, an area including the light emitting areas EA of the four adjacent subpixels SP may have a rhombus shape. Accordingly, respective four anode electrodes AE of the adjacent four subpixels SP in the first optical area OA1 may be arranged adjacent to one another in the diagonal direction.

In contrast, in the example of FIG. 10, respective circuit portions of the adjacent four subpixels SP in the first optical area OA1 may be arranged in parallel in the horizontal direction. The circuit portion of each of the four subpixels SP may be a portion in which in the example of FIG. 9, the remaining elements (e.g., the transistors (DRT, and T1 to T6)) except for the light emitting element ED, and the storage capacitor Cst are disposed.

Figure 11:
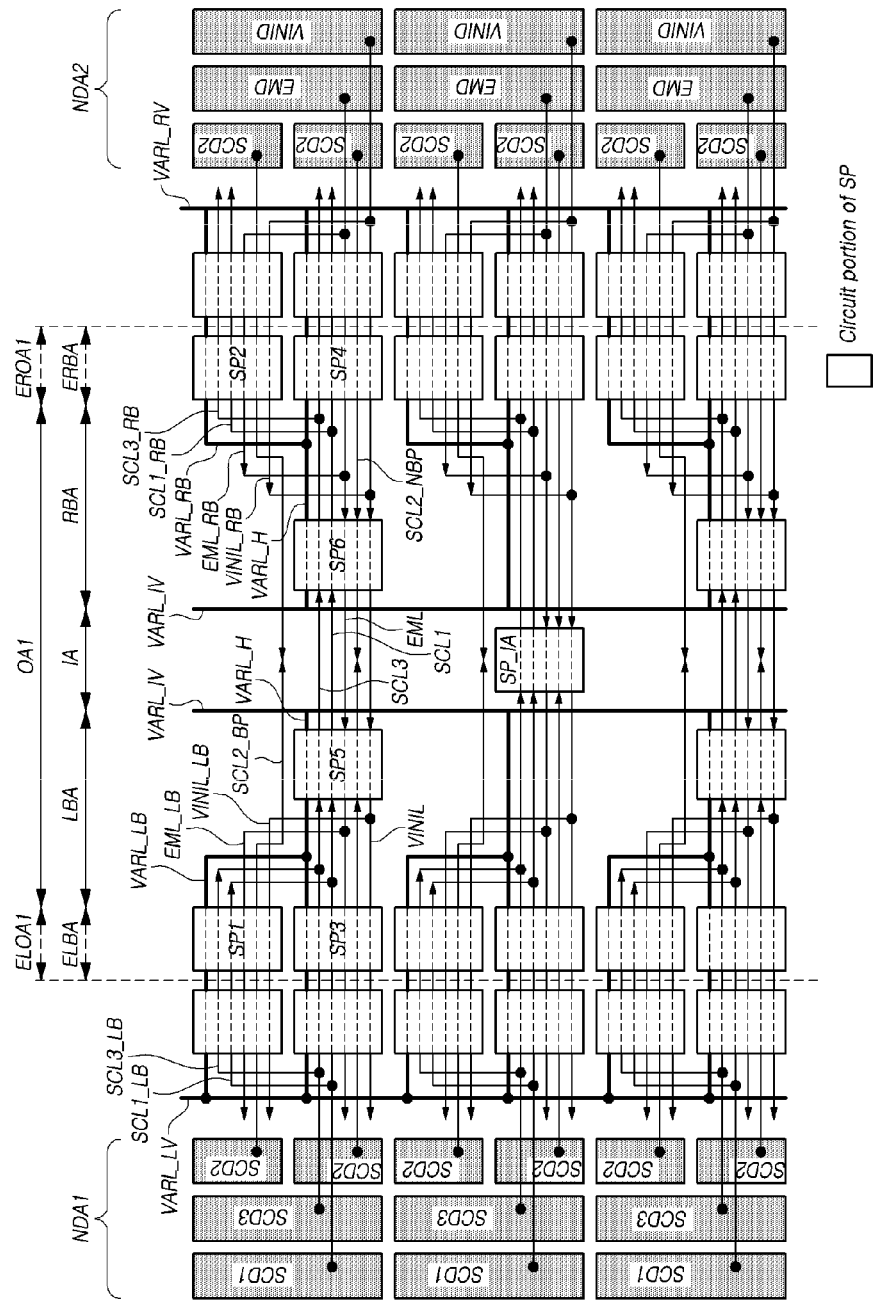
FIG. 11 illustrates an example arrangement structure of signal lines running through the first optical area of the display device according to aspects of the present disclosure.

Hereinafter, an example in which the pixel circuit of FIG. 9 is applied to the line arrangement structure of FIG. 10 will be described with reference to FIGS. 11 and 12. FIG. 11 illustrates an example arrangement structure of signal lines running through the first optical area OA1 of the display device 100 according to aspects of the present disclosure.

With reference to FIG. 11, in some embodiments, the display panel 110 of the display device 100 may include, among a plurality of subpixels SP, one or more first subpixels SP1 located near a left boundary (e.g., the first extended bezel area ELBA) of the first optical area OA1, and one or more second subpixels SP2 located near a right boundary (e.g., the second extended bezel area ERBA) of the first optical area OA1 and spaced apart from the first subpixel SP1 in the horizontal direction.

With reference to FIG. 11, each of the plurality of subpixels SP may receive S types of signals. Here, S may be a natural number of 2 or more. In some embodiments, the display panel 110 of the display device 100 may include a plurality of first horizontal lines HL1 among the signal lines running through the first optical area OA1.

In some embodiments, when the S types of signals supplied to each of the plurality of subpixels SP are limited to signals supplied from horizontal lines, five signals among the S types of signals may be defined as the first to third scan signals (SCAN1, SCAN2, and SCAN3), the emission control signal EM, and the initialization voltage VINI, in the pixel circuit of FIG. 9. In some embodiments, an additional signal among the S types of signals may be defined as the anode reset voltage VAR in the pixel circuit of FIG. 9.

In some embodiments, the display panel 110 of the display device 100 may include, among the plurality of first horizontal lines HL1 running through the first optical area OA1, K number of first horizontal lines HL1 for supplying K types of signals among the S types of signals to the first subpixel SP1 and the second subpixel P2. Here, K may be 1 or more and a natural number less than S.

According to the example of FIG. 11, the K types of signals among the S types of signals may be one type of signal, for example, a second scan signal SCAN2. In this example, one first horizontal line HL1 for supplying the second scan signal SCAN2, which is the K type of signal, to the first subpixel SP1 and the second subpixel SP2 may be a second scan line SCL2_BP.

Hereinafter, for convenience of description, in discussions that follow, it is assumed that the S types of signals are first to third scan signals (e.g., the first to third scan signals (SCAN1, SCAN2, and SCAN3) in the example of FIG. 9), an emission control signal (e.g., the emission control signal EM in the example of FIG. 9), an initialization voltage (e.g., the initialization voltage VINT in the example of FIG. 9), and an anode reset voltage (e.g., the anode reset voltage VAR in the example of FIG. 9), and the K type of signal is a second scan signal (e.g., the second scan signal SCAN2 in the example of FIG. 9).

Accordingly, hereinafter, the S types of signals are referred to as 6 types of gate signals (SCAN1, SCAN2, SCAN3, EM, VINI, and VAR), and the K type(s) of signal(s) is referred to as a second scan signal SCAN2. In addition, S number of first horizontal lines HL1 for transmitting the S types of signals are referred to as 6 types of gate lines that are first to third scan lines (SCL1, SCL2_NBP/SCL2_BP, SCL3), an emission control line EML, an initialization voltage line VINIL, and an anode voltage reset line VARL. K number of first horizontal lines HL1 for transmitting the K types of signals are referred to as a second scan line (SCL2_BP, SCL2_NBP).

In accordance with FIG. 11, in some embodiments, the anode voltage reset line VARL may include a first vertical anode voltage reset line VARL_LV extending in the vertical direction in a first non-display area NDA1, a second vertical anode voltage reset line VARL_RV extending in the vertical direction in a second non-display area NDA2, and a horizontal anode voltage reset line VARL_H extending in the horizontal direction in the display area DA. In some embodiments, the anode voltage reset line VARL may further include a third vertical anode voltage reset line VARL_IV extending in the vertical direction inside of the first optical area OA1.

With reference to FIG. 11, a second scan line SCL2_BP overlapping the first subpixel SP1 and the second subpixel SP2 among the plurality of first horizontal lines HL1 running through the first optical area OA1 may be a bypass line that is not connected to one or more subpixels SP other than the first subpixel SP1 and the second subpixel SP2 in the first optical area OA1, and bypasses the one or more subpixels SP between the first subpixel SP1 and the second subpixels SP2.

In some embodiments, the display panel 110 of the display device 100 may further include a third subpixel SP3, a fourth subpixel SP4, a fifth subpixel SP SP5, and a sixth subpixel SP6 among the plurality of subpixels SP. The third subpixel SP3 may be located near the left boundary of the first optical area OA1 (e.g., the first extended bezel area ERBA), and located to be spaced from the first subpixel SP1 in the vertical direction. The fourth subpixel SP4 may be located near the right boundary of the first optical area OA1 (e.g., the second extended bezel area ERBB), and located to be spaced from the second subpixel SP2 in the vertical direction. The fifth subpixel SP5 and the sixth subpixel SP6 may be located inside of the first optical area OA1 and located between the third subpixel SP3 and the fourth subpixel SP4.

In some embodiments, the display panel 110 of the display device 100 may further include the 6 types of gate lines (SCL1, SCL2_NBP, SCL3, EML, VINIL, and VARL), which are the S number of first horizontal lines HL1, for supplying the 6 types of gate signals (SCAN1, SCAN2, SCANS, EM, VINI, VAR) to the third subpixel SP3, the fifth subpixel SP5, the sixth subpixel SP6, and the fourth subpixel SP4, among the plurality of first horizontal lines HL1 running through the first optical area OA1. For example, the 6 types of gate lines (SCL1, SCL2_NBP, SCL3, EML, VINIL, and VARL), which are the S number of first horizontal lines HL1, may be disposed to overlap the third subpixel SP3, the fifth subpixel SP5, the sixth subpixel SP6, and the fourth subpixel SP4.

In some embodiments, the 6 types of gate lines (SCL1, SCL2_NBP, SCL3, EML, VINIL, and VARL corresponding to the third subpixel SP3, the fifth subpixel SP5, the sixth subpixel SP6, and the fourth subpixel SP4 may be a first scan line SCL1, a second scan line SCL2_NBP, a third scan line SCL3, an emission control line EML, an initialization voltage line VINIL, and an anode voltage reset line VARL.

In some embodiments, 5 (S−K, S=6, K=1) number of first horizontal lines (SCL1, SCL3, EML, VINIL, and VARL) among the 6 types of gate lines (SCL1, SCL2_NBP, SCL3, EML, VINIL, and VARL) running through the first optical area OA1 may bifurcate at a first point (e.g., a point on the left side thereof), and thereby, further include 5 (S−K, S=6, K=1) number of first branch lines (SCL1_LB, SCL3_LB, EML_LB, VINIL_LB, and VARL_LB) for supplying 5 (S−K, S=6, K=1) types of gate signals (SCAN1, SCAN3, EM, VINI, VAR) to the first pixel SP1.

In some embodiments, the 5 (S−K, S=6, K=1) number of first horizontal lines (SCL1, SCL3, EML, VINIL, and VARL) among the 6 types of gate lines (SCL1, SCL2_NBP, SCL3, EML, VINIL, and VARL) running through the first optical area OA1 may bifurcate at a second point (e.g., a point on the right side thereof), and thereby, further include 5 (S−K, S=6, K=1) number of second branch lines (SCL1_RB, SCL3_RB, EML_RB, VINIL_RB, and VARL_RB) for supplying the 5 (S−K, S=6, K=1) types of gate signals (SCAN1, SCAN3, EM, VINI, VAR) to the second pixel SP2.

Here, the first point and the second point may be placed in or near the first optical area OA1. The second point of the first and second points may be placed on the relatively right side of the display area compared with the first point, and may be a point relatively closer to the second non-display area NDA2 than the first point.

In one embodiment, in the display panel 110 of the display device 100, the 6 types of gate lines (SCL1, SCL2_NBP/SCL2_BP, SCL3, EML, VINIL, VARL), which are the S number of first horizontal lines HL1, may be located in the same layer. In another embodiment, in the display panel 110 of the display device 100, at least one of the 6 types of gate lines (SCL1, SCL2_NBP/SCL2_BP, SCL3, EML, VINIL, VARL), which are the S number of first horizontal lines HL1, may be located in a different layer from the remaining lines.

In some embodiments, in the display panel 110 of the display device 100, the second scan line SCL2_BP that is a bypass line may be disposed to avoid a plurality of first transmission areas TA1 of the first optical area OA1, and the second scan line SCL2_NBP that is a non-bypass line may be also disposed to avoid the plurality of first transmission areas TA1 in the first optical area OA1. A direction in which the second scan line SCL2_BP that is the bypass line avoids the transmission areas TA1 may be opposite to a direction in which the second scan line SCL2_NBP that is the non-bypass line avoids the transmission areas TA1.

With reference to FIG. 11, in some embodiments, the display panel 110 of the display device 100 may further include, among the plurality of subpixels SP, a third subpixel SP3 located near the left boundary ELBA of the first optical area OA1 and located to be spaced apart from the first subpixel SP1 in the vertical direction, a fourth subpixel SP4 located near the right boundary ERBA of the first optical area OA1 and located to be spaced apart from the second subpixel SP2 in the vertical direction, and a fifth subpixel SP5 located inside of the first optical area OA1 and located between the third subpixel SP3 and the fourth subpixel SP4.

The first subpixel SP1 and the second subpixel SP2 may be included in a first subpixel row. The third subpixel SP3, the fifth subpixel SP5, and the fourth subpixel SP4 may be included in a second subpixel row.

The S types of signals may include a first scan signal SCAN1, a second scan signal SCAN2, a third scan signal SCAN3, and an emission control signal EM.

In some embodiments, the display panel 110 of the display device 100 may further include, among the plurality of first horizontal lines HL1, a first scan line SCL1 for supplying the first scan signal SCAN1 to the second subpixel row, a second scan line SCL2_NBP for supplying the second scan signal SCAN2 to the second subpixel row, a third scan line SCL3 for supplying the third scan signal SCAN3 to the second subpixel row, and an emission control line EML for supplying the emission control signal EM to the second subpixel row.

In some embodiments, the plurality of first horizontal lines HL1 may further include a first scan branch line SCL1_LB bifurcated at a first point of the first scan line SCL1 and supplying the first scan signal SCAN1 to the first subpixel SP1 included in the first subpixel row, a third scan branch line SCL3_LB bifurcated at a first point of the third scan line SCL3 and supplying the third scan signal SCAN3 to the first subpixel SP1 included in the first subpixel row, and an emission control branch line EML_LB bifurcated at a first point of the emission control line EML and supplying the emission control signal EM to the first subpixel SP1 included in the first subpixel row.

In some embodiments, the plurality of first horizontal lines HL1 may further include another first scan branch line SCL1_RB bifurcated at a second point of the first scan line SCL1 and supplying the first scan signal SCAN1 to the second subpixel SP2 included in the first subpixel row, another third scan branch line SCL3_RB bifurcated at a second point of the third scan line SCL3 and supplying the third scan signal SCAN3 to the second subpixel SP2 included in the first subpixel row, and another emission control branch line EML_RB bifurcated at a second point of the emission control line EML and supplying the emission control signal EM to the second subpixel SP2 included in the first subpixel row.

In some embodiments, the display panel 110 of the display device 100 may further include, among the plurality of first horizontal lines HL1, another second scan line SCL2_BP for supplying the second scan signal SCAN2 to the first subpixel row.

The second scan line SCL2_BP disposed in the first subpixel row may be a bypass line, which bypasses other subpixels SP in the first optical area OA1 without being connected to such other subpixels SP.

In accordance with FIG. 11, in some embodiments, the display panel 110 of the display device 100 may include a driving circuit connected to, or disposed in, the non-display area NDA. The non-display area NDA may include a first non-display area NDA1 located on a first side of the display area DA and a second non-display area NDA2 located on a second side of the display area DA.

The driving circuit may include a first scan driving circuit SCD1 for outputting the first scan signal SCAN1, a second scan driving circuit SCD2 for outputting the second scan signal SCAN2, a third scan driving circuit SCD3 for outputting the third scan signal SCANS, and an emission control driving circuit EMD for outputting the emission control signal EM. Each of the first scan driving circuit SCD1, the third scan driving circuit SCD3, and the emission control driving circuit EMD may be connected to, or disposed in, one of the first non-display area NDA1 and the second non-display area NDA2. The second scan driving circuit SCD2 may be connected to, or disposed in, both the first non-display area NDA1 and the second non-display area NDA2. The second scan driving circuit SCD2 can output a corresponding second scan signal SCAN2 to each of the second scan line SCL2_BP that is the bypass line, and the second scan line SCL2_NBP that is the non-bypass line.

With reference to FIG. 11, in some embodiments, the display panel 110 of the display device 100 may further include an initialization signal line VINIL, an initialization branch line VINIL_LB, and another initialization branch line VINIL_RB among the plurality of first horizontal lines HL1 running through the first optical area OA1. The initialization signal line VINIL may be disposed to correspond to the second subpixel row and can supply the initialization signal VINI to the second subpixel row. The initialization branch line VINIL_LB may, for example, bifurcate at a first point of the initialization signal line VINIL and can supply the initialization signal VINI to the first subpixel SP1 included in the first subpixel row. The another initialization branch line VINIL_RB may, for example, bifurcate at a second point of the initialization signal line VINIL and can supply the initialization signal VINI to the second subpixel SP2 included in the first subpixel row.

With reference to FIG. 11, in some embodiments, the display panel 110 of the display device 100 may include the driving circuit connected to, or disposed in, the non-display area NDA.

The non-display area NDA may include the first non-display area NDA1 located on a first side of the display area DA and the second non-display area NDA2 located on a second side of the display area DA. The driving circuit may include an initialization driving circuit VINID for outputting the initialization signal VINI. The initialization driving circuit VINID may be connected to, or disposed in, one of the first non-display area NDA1 and the second non-display area NDA2.

Figure 12:
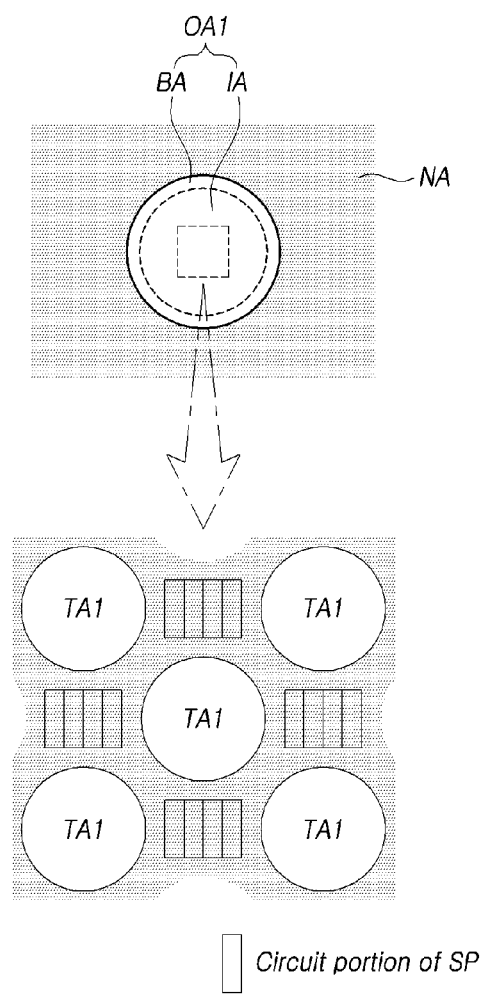
FIGS. 12 and 13 more specifically illustrate example arrangement structures of bypass lines inside of the first optical area of the display device according to aspects of the present disclosure.
Figure 13:
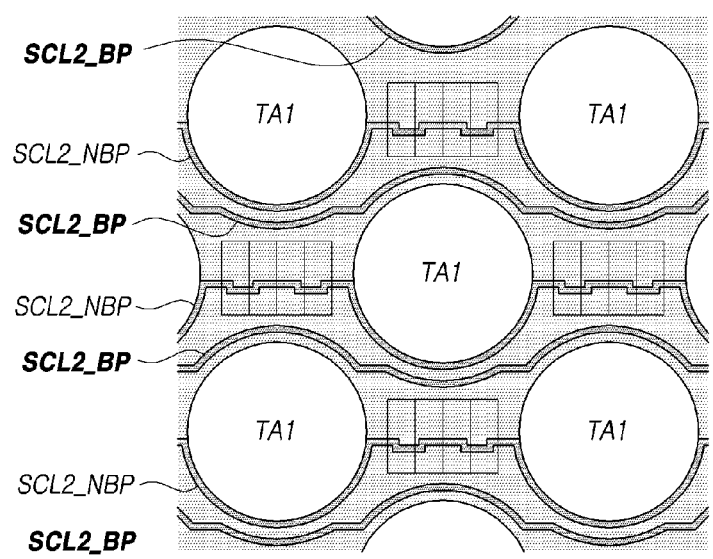

FIGS. 12 and 13 more specifically illustrate example arrangement structures of bypass lines inside of the first optical area OA1 of the display device 100 according to aspects of the present disclosure.

As shown in FIG. 12, in some embodiments, a second scan line SCL2_BP that is a bypass line and a second scan line SCL2_NBP that is a non-bypass line may be alternately disposed in the first optical area OA1. The second scan line SCL2_BP that is the bypass line may be a signal line not connected to circuit portions of subpixels SP in the first optical area OA1. The second scan line SCL2_NBP that is the non-bypass line may be a signal line connected to circuit portions of subpixels SP in the first optical area OA1.

As described above, although the examples where the second scan line SCL2_BP is disposed as the bypass line have been discussed, embodiments of the present disclosure are not limited thereto. For example, one or more gate lines other than the second scan line SCL2_BP among the six types of gate lines (SCL1, SCL2, SCL3, EML, VINIL, and VARL) may be disposed as the bypass line.

Figure 14:
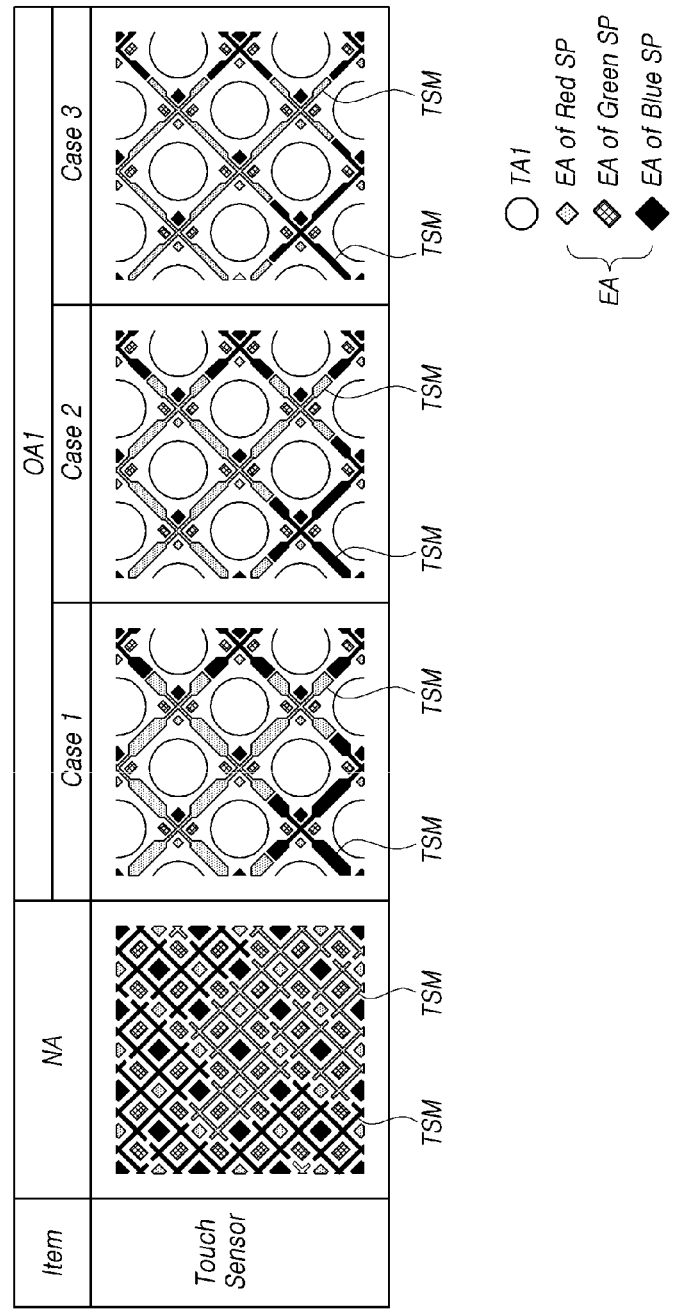
FIG. 14 illustrates an example arrangement structure of a touch sensor metal in each of the normal area and the first optical area of the display device according to aspects of the present disclosure.
Figure 15:
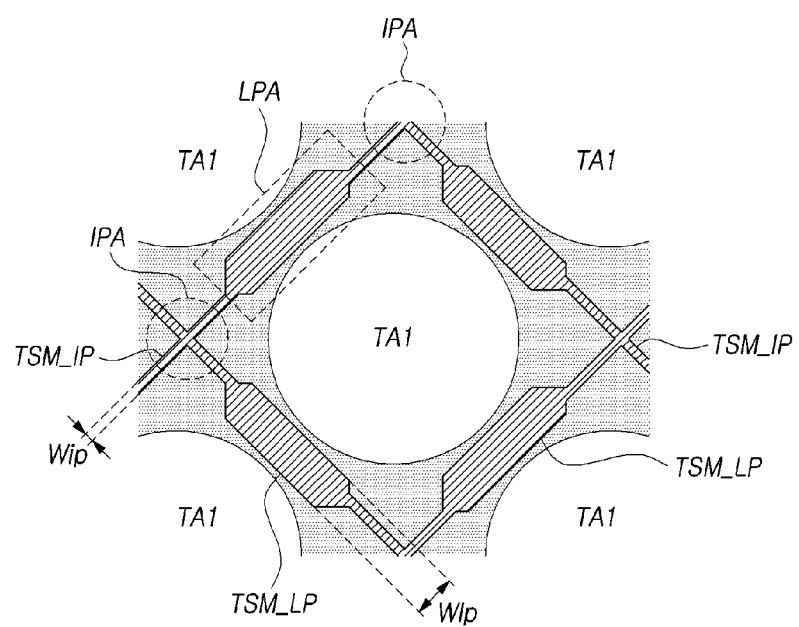
FIG. 15 is an example enlarged view of the arrangement structure of the touch sensor metal inside of the first optical area of the display device according to aspects of the present disclosure.

FIG. 14 illustrates an example arrangement structure of a touch sensor metal in each of the normal area NA and the first optical area OA1 of the display device 100 according to aspects of the present disclosure. FIG. 15 is an example enlarged view of the arrangement structure of the touch sensor metal inside of the first optical area OA1 of the display device 100 according to aspects of the present disclosure.

As described above, in some embodiments, the display panel 110 of the display device 100 may be further include a cathode electrode CE disposed in a plurality of light emitting areas EA included in the normal area NA and the first optical area OA1 and not disposed in a plurality of first transmission areas TA1 of the first optical area OA1, and an encapsulation layer ENCAP disposed on the cathode electrode CE.

As described above, the display device 100 according to aspects of the present disclosure can provide a touch sensing function. To provide this function, in an example where a touch sensor TS is embedded in the display panel 110, the display panel 110 may have the vertical structure as shown in FIG. 7. In this example, for example, the display panel 110 of the display device 100 may further include a touch sensor metal TSM with a mesh pattern located on the encapsulation layer ENCAP and forming the touch sensor TS.

As shown in FIG. 14, in some embodiments, in the normal area NA, the touch sensor metal TSM may be disposed in the mesh pattern while avoiding the light emitting areas EA. Accordingly, even when the touch sensor TS is embedded in the display panel 110, a decrease in luminous efficiency in the normal area NA can be prevented or at least reduced.

In some embodiments, in the first optical area OA1, the touch sensor metal TSM can be disposed to avoid the plurality of light emitting areas EA in the first optical area OA1 and disposed to further avoid the plurality of first transmission areas TA1 in the first optical area OA1. As a result, touch sensing in the first optical area OA1 can be normally carried out, and thereby, a decrease in luminous efficiency and a decrease in transmittance in the first optical area OA1 can be prevented or at least reduced.

In some embodiments, the density of touch sensor metal TSM forming a plurality of mesh units in the first optical area OA1 may be less than the density of touch sensor metal TSM forming a plurality of mesh units in the normal area NA.

However, a line width of at least a portion of the touch sensor metal TSM of the first optical area OA1 may be greater than a line width of the touch sensor metal TSM of the normal area NA. For example, a maximum line width of the touch sensor metal TSM of the first optical area OA1 may be greater than a maximum line width of the touch sensor metal TSM of the normal area NA.

Accordingly, although the density of the touch sensor metal TSM forming mesh units in the first optical area OA1 is less than the density of the touch sensor metal TSM forming mesh units in the normal area NA, a capacitance needed for touch sensing through the touch sensor metal TSM in the first optical area OA1 may become a level similar to a capacitance needed for touch sensing through the touch sensor metal TSM in the normal area NA. Accordingly, the touch sensitivity of the first optical area OA1 can be improved.

Considering a difference between the density of the touch sensor metal TSM in the first optical area OA1 and the density of the touch sensor metal TSM in the normal area NA, as shown in Case 1, Case 2, and Case 3 in FIG. 14, the maximum line width of the touch sensor metal TSM in the first optical area OA1 can be variously adjusted.

As shown in FIG. 15, in the first optical area OA1, the touch sensor metal TSM may have, for example, the mesh pattern. According to this example, the touch sensor metal TSM in the first optical area OA1 may include intersecting parts TSM_IP in intersecting areas IPA and link parts TSM_LP in link areas LPA for connecting the intersecting parts TSM_IP.

In the touch sensor metal TSM included in the first optical area OA1, a line width Wlp of each of the link parts TSM_LP may be greater than a line width Wip of each of the intersecting parts TSM_IP.

This enables not only the touch sensor metal TSM of the first optical area OA1 to avoid the light emitting areas EA and the first transmission areas TA1, but a capacitance needed for touch sensing through the touch sensor metal TSM in the first optical area OA1 to reach a level remarkably similar to a capacitance needed for touch sensing through the touch sensor metal TSM in the normal area NA. Accordingly, the light emitting performance and touch sensitivity of the first optical area OA1 can be improved.

In some embodiments, a plurality of first horizontal lines HL1 running through the first optical area OA1 may partially overlap the touch sensor metal TSM.

The embodiments described above will be briefly described as follows.

According to aspects of the present disclosure, a display device is provided that includes: a display panel that includes a display area including a first optical area and a normal area located outside of the first optical area, and a non-display area, and includes a plurality of subpixels and a plurality of signal lines, the first optical area including a plurality of light emitting areas and a plurality of first transmission areas, and the normal area including a plurality of light emitting areas; and a first optical electronic device located under, in a lower portion of, the display panel and overlapping at least a portion of the first optical area included in the display area.

The display panel may include a plurality of first horizontal lines running through the first optical area among plurality of signal lines.

The display panel may include a bypass line connected to subpixels at both boundaries of the first optical area and not connected to other subpixels inside of the first optical area, and a non-bypass line connected to the subpixels at both boundaries of the first optical area and the subpixels inside of the first optical area, among the plurality of first horizontal lines may include.

The bypass line and the non-bypass line may carry the same type of signal.

The bypass line and the non-bypass line may be alternately disposed.

The plurality of first horizontal lines may be located in a same layer.

One or more of the plurality of first horizontal lines may vertically overlap one or more of the remaining first horizontal lines. In this example, at least one of the plurality of first horizontal lines may be located in a different layer from the remaining first horizontal lines.

The plurality of first horizontal lines may be disposed to avoid the plurality of first transmission areas in the first optical area.

At least one bypass line among the plurality of first horizontal lines may avoid each of a plurality of first transmission areas in a manner that bypasses the first transmission areas in a first direction. At least one bypass line among the plurality of first horizontal lines may avoid each of a plurality of first transmission areas in a manner that bypasses the first transmission areas in alternate first and second directions opposite to each other. At least one non-bypass line among the plurality of first horizontal lines may avoid each of a plurality of first transmission areas in a manner that bypasses the first transmission areas in the first or second direction.

Each of the plurality of subpixels may include: a light emitting element including an anode electrode, an emission layer, and a cathode electrode; a driving transistor for driving the light emitting element, the driving transistor including a first node, a second node, and a third node; a first transistor for controlling a connection between the first node and the second node, the first transistor controlled by a first scan signal; a second transistor for controlling a connection between the third node and a data line, the second transistor controlled by a second scan signal; a third transistor for controlling a connection between the third node and a driving voltage line, the third transistor controlled by an emission control signal; a fourth transistor for controlling a connection between the anode electrode and the second node, the fourth transistor controlled by the emission control signal; a fifth transistor for controlling a connection between an initialization signal line and the second node, the fifth transistor controlled by a third scan signal; a sixth transistor for controlling a connection between an anode reset voltage line and the anode electrode; and a storage capacitor connected between the first node and the driving voltage line.

In an example where each of the plurality of subpixels has a pixel circuit described above, the display panel may include a first scan line for supplying the first scan signal, a second scan line for supplying the second scan signal, a third scan line semicolon for supplying the third scan signal, and an emission control line for supplying the emission control signal, among the plurality of first horizontal lines.

At least one bypass line among the plurality of first horizontal lines may be a second scan line for supplying the second scan signal to a first subpixel among the plurality of subpixels.

At least one non-bypass line among the plurality of first horizontal lines may be another second scan line for supplying another second scan signal to a second subpixel different from the first subpixel among the plurality of subpixels.

The display panel may include a driving circuit connected to, or disposed in, the non-display area. The non-display area may include a first non-display area located on a first side of the display area and a second non-display area located on a second side of the display area.

The driving circuit may include a first scan driving circuit for outputting the first scan signal, a second scan driving circuit for outputting the second scan signal, a third scan driving circuit for outputting the third scan signal, and an emission control driving circuit for outputting the emission control signal.

Each of the first scan driving circuit, the third scan driving circuit, and the emission control driving circuit may be connected to, or disposed in, one of the first non-display area and the second non-display area.

The second scan driving circuit may be connected to, or disposed in, both the first non-display area and the second non-display area.

The second scan driving circuit can output a corresponding second scan signal to each of the second scan line that is a bypass line and the second scan line that is a non-bypass line.

The driving circuit may further include an initialization driving circuit for outputting the initialization signal. The initialization driving circuit may be connected to, or disposed in, one of the first non-display area and the second non-display area.

The display panel may further include a shield metal disposed under the driving transistor and disposed to avoid the plurality of first transmission areas. The shield metal may be electrically connected to a driving voltage line.

The display panel may further include a cathode electrode disposed in a plurality of light emitting areas included in the normal area and the first optical area and not disposed in a plurality of first transmission areas of the first optical area.

The display panel may further include an encapsulation layer located on the cathode electrode, and a touch sensor metal with a mesh pattern located on the encapsulation layer.

The touch sensor metal may be disposed to avoid a plurality of light emitting areas of the normal area. The touch sensor metal may be disposed to avoid the plurality of light emitting areas and the plurality of first transmitting areas included in the first optical area.

The touch sensor metal of the first optical area may include a portion having a greater line width than the touch sensor metal of the normal area.

The touch sensor metal may include intersecting parts and link parts for connecting the intersecting parts, and a line width of each of the link parts may be greater than a line width of each of the intersecting parts.

The plurality of first horizontal lines may partially overlap the touch sensor metal.

The first optical electronic device may be a camera or a sensor, and the number of subpixels per unit area in the first optical area may be less than the number of subpixels per unit area in the normal area.

The display area may further include a second optical area different from the first optical area and the normal area.

The display device may further include a second optical electronic device located under, in a lower portion of, the display panel and overlapping at least a portion of the second optical area. In this example, the normal area may or may not be disposed between the first optical area and the second optical area.

The first optical electronic device may be a camera, the second optical electronic device may be a sensor, and the transmittance of the first optical area may be greater than or equal to that of the second optical area.

The number of subpixels per unit area in the first optical area may be less than the number of subpixels per unit area in the normal area.

The number of subpixels per unit area in the second optical area may be equal to or greater than the number of subpixels per unit area in the first optical area, and be less than the number of subpixels per unit area in the normal area.

According to the embodiments described herein, the display panel and the display device can be provided that are capable of reducing the non-display area of the display panel and enabling an optical electronic device such as a camera, a sensor, and/or the like not to be exposed in the front surface of the display panel by disposing the optical electronic device under the display area, or in a lower portion, of the display panel.

According to the embodiments described herein, the display panel and the display device can be provided that have a light transmission structure for enabling the optical electronic device under the display area, or in a lower portion, of the display panel to normally receive light transmitting the display panel.

According to the embodiments described herein, the display panel and the display device can be provided that are capable of normally performing display driving in an optical area included in the display area of the display panel and overlapping the optical electronic device.

According to the embodiments described herein, the display device can be provided that is capable of enabling a signal line to run through the optical area overlapping the optical electronic device in a manner that is suitable for the characteristics of the optical area.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a display panel including a plurality of subpixels and a plurality of signal lines, the display panel defining a display area having a first optical area and a normal area located outside of the first optical area, and a non-display area, wherein the first optical area comprises a plurality of light emitting areas and a plurality of first transmission areas, and wherein the normal area comprises a plurality of light emitting areas,
wherein the display panel includes a plurality of first horizontal lines among the plurality of signal lines disposed through the first optical area, and
wherein the first horizontal lines include a bypass line connected to subpixels at both boundaries of the first optical area and not connected to other subpixels inside of the first optical area, and a non-bypass line connected to the subpixels at both boundaries of the first optical area and the subpixels inside of the first optical area,
wherein each of the plurality of subpixels includes:
a light emitting element having an anode electrode, an emission layer, and a cathode electrode;
a driving transistor configured to drive the light emitting element, the driving transistor having a first node, a second node, and a third node;
a first transistor configured to control a connection between the first node and the second node, the first transistor configured to be controlled by a first scan signal;
a second transistor configured to control a connection between the third node and a data line, the second transistor configured to be controlled by a second scan signal;
a third transistor configured to control a connection between the third node and a driving voltage line, the third transistor configured to be control by an emission control signal;
a fourth transistor configured to control a connection between the anode electrode and the second node, the fourth transistor configured to control by the emission control signal;
a fifth transistor configured to control a connection between an initialization signal line and the second node, the fifth transistor configured to be controlled by a third scan signal;
a sixth transistor configured to control a connection between an anode reset voltage line and the anode electrode; and
a storage capacitor connected between the first node and the driving voltage line, and
wherein the plurality of first horizontal lines includes a first scan line configured to supply the first scan signal, a second scan line configured to supply the second scan signal, a third scan line configured to supply the third scan signal, and an emission control line configured to supply the emission control signal.

2. The display panel according to claim 1, further comprising a first optical electronic device under the display panel and at a portion overlapping at least a portion of the first optical area of the display area.

3. The display panel according to claim 1, wherein the bypass line and the non-bypass line are alternately disposed, and wherein the bypass line and the non-bypass line carry a same type of signal.

4. The display panel according to claim 1, wherein the plurality of first horizontal lines are located in a same layer.

5. The display panel according to claim 1, wherein at least one of the plurality of first horizontal lines is in a different layer than the remaining ones of the first horizontal lines such that the at least one the plurality of first horizontal lines vertically overlaps the remaining ones of first horizontal lines.

6. The display panel according to claim 1, wherein the plurality of first horizontal lines are absent in the plurality of the first transmission areas of the first optical area.

7. The display panel according to claim 1, wherein the first horizontal lines include a bypass line connected to subpixels at both boundaries of the first optical area and not connected to other subpixels inside of the first optical area, and a non-bypass line connected to the subpixels at both boundaries of the first optical area and the subpixels inside of the first optical area, and
wherein the bypass line is configured to supply the second scan signal to a first subpixel among the plurality of subpixels.

8. The display panel according to claim 1, further comprising an encapsulation layer on a cathode electrode, and a touch sensor metal with a mesh pattern on the encapsulation layer,
wherein the touch sensor metal is absent in the plurality of light emitting areas of the normal area, and wherein the touch sensor metal is absent in the plurality of light emitting areas and the plurality of first transmitting areas of the first optical area.

9. The display panel according to claim 8, wherein a portion the touch sensor metal in the first optical area has a greater line width than a portion of the touch sensor metal in the normal area.

10. The display panel according to claim 8, wherein the touch sensor metal comprise intersecting parts and link parts connecting the intersecting parts, and wherein a line width of the link parts is greater than a line width of the intersecting parts.

11. The display panel according to claim 1, further comprising an optical electronic device under the display panel, wherein the optical electronic device includes a camera or a sensor.

12. The display panel according to claim 1, wherein the display area further has a second optical area, the second optical area being different from the first optical area and the normal area, and
wherein the display panel further comprises a second optical electronic device under the display panel and at a portion overlapping at least a portion of the second optical area of the display area.

13. The display device according to claim 12, wherein the first optical electronic device is a camera, the second optical electronic device is a sensor, and
wherein a transmittance of the first optical area is greater than or equal to that of the second optical area.

14. The display device according to claim 12, wherein the number of subpixels per unit area in the first optical area is less than the number of subpixels per unit area in the normal area, and
wherein the number of subpixels per unit area in the second optical area is greater than or equal to the number of subpixels per unit area in the first optical area, and is less than the number of subpixels per unit area in the normal area.

15. The display device according to claim 1, wherein the display panel comprises a driving circuit disposed in the non-display area,
wherein the non-display area comprises a first non-display area on a first side of the display area and a second non-display area on a second side of the display area,
wherein the driving circuit comprises:
a first scan driving circuit configured to supply the first scan signal;
a second scan driving circuit configured to supply the second scan signal;
a third scan driving circuit configured to supply the third scan signal; and
an emission control driving circuit configured to supply the emission control signal,
wherein each of the first scan driving circuit, the third scan driving circuit, and the emission control driving circuit is disposed in one of the first non-display area and the second non-display area, and the second scan driving circuit is disposed in both the first non-display area and the second non-display area, and
wherein the second scan driving circuit is configured to output the second scan signal to a second scan line that is the bypass line, and is configured to output the second scan signal to a second scan line that is the non-bypass line.

16. The display device according to claim 15, wherein the driving circuit further comprises an initialization driving circuit configured to output the initialization signal, and the initialization driving circuit is disposed in one of the first non-display area and the second non-display area.

17. The display device according to claim 1, wherein the display panel further comprises a shield metal under the driving transistor and is absent in the plurality of first transmission areas, and wherein the shield metal is electrically connected to the driving voltage line.

18. The display device according to claim 1, wherein the display panel further comprises a cathode electrode in the plurality of light emitting areas of the normal area and the plurality of light emitting areas of the first optical area, and absent in the plurality of first transmission areas of the first optical area.

* * * * *